United States Patent
Martinson et al.

(10) Patent No.: US 9,773,991 B2
(45) Date of Patent: Sep. 26, 2017

(54) NON-HYDROLYTIC METAL OXIDE FILMS FOR PEROVSKITE HALIDE OVERCOATING AND STABILIZATION

(71) Applicant: UCHICAGO ARGONNE, LLC, Chicago, IL (US)

(72) Inventors: Alex B. Martinson, Naperville, IL (US); In Soo Kim, Woodridge, IL (US)

(73) Assignee: UCHICAGO ARGONNE, LLC, Chicago, IL (US)

(*) Notice: Subject to any disclaimer, the term of this patent is extended or adjusted under 35 U.S.C. 154(b) by 0 days.

(21) Appl. No.: 14/819,248

(22) Filed: Aug. 5, 2015

(65) Prior Publication Data

US 2017/0040560 A1 Feb. 9, 2017

(51) Int. Cl.
- H01L 21/00 (2006.01)
- H01L 51/44 (2006.01)
- H01L 31/032 (2006.01)
- H01L 31/0216 (2014.01)
- H01L 31/0256 (2006.01)

(52) U.S. Cl.
CPC ...... H01L 51/448 (2013.01); H01L 31/02167 (2013.01); H01L 31/032 (2013.01); *H01L 2031/0344* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 2004/0077182 A1* | 4/2004 | Lim | C23C 16/308 438/785 |
| 2011/0014359 A1* | 1/2011 | Hashim | C23C 16/405 427/80 |

FOREIGN PATENT DOCUMENTS

WO WO-2014/020499 2/2014

OTHER PUBLICATIONS

Dong et al., Improvement of the humidity stability of organic inorganic perovskite solar cells using ultrathin $Al_2O_3$ layers prepared by atomic layer deposition, The Royal Society of Chemistry, Journal of Materials Chemistry A, Jan. 20, 2015, pp. 5360-5367.

(Continued)

*Primary Examiner* — Shaun Campbell
(74) *Attorney, Agent, or Firm* — Foley & Lardner LLP

(57) ABSTRACT

A method of protecting a perovskite halide film from moisture and temperature includes positioning the perovskite halide film in a chamber. The chamber is maintained at a temperature of less than 200 degrees Celsius. An organo-metal compound is inserted into the chamber. A non-hydrolytic oxygen source is subsequently inserted into the chamber. The inserting of the organo-metal compound and subsequent inserting of the non-hydrolytic oxygen source into the chamber is repeated for a predetermined number of cycles. The non-hydrolytic oxygen source and the organo-metal compound interact in the chamber to deposit a non-hydrolytic metal oxide film on perovskite halide film. The non-hydrolytic metal oxide film protects the perovskite halide film from relative humidity of greater than 35% and a temperature of greater than 150 degrees Celsius, respectively.

16 Claims, 14 Drawing Sheets

(56) References Cited

OTHER PUBLICATIONS

Habisreutinger et al., Carbon Nanotube/Polymer Composites as a Highly Stable Hole Collection Layer in Perovskite Solar Cells, ACS Publications Nano Letters, Pubs.acs.org/NanoLett, No. 14, Sep. 16, 2014, pp. 5561-5568.
Rauwel, et al., Non-Aqueous Routes to Metal Oxide Thin Films by Atomic Layer Deposition**, www.angewandte.org, Angew. Chem. Int. Ed. vol. 47, Issue 19, Apr. 28, 2018, pp. 3592-3595.
Ritala, et al., Atomic Layer Deposition of Oxide Thin Films with Metal Alkoxides as Oxygen Sources, www.sciencemag.org Science vol. 288, Apr. 14, 2000 pp. 319-321.

* cited by examiner

NON-HYDROLYTIC METAL OXIDE FILMS FOR PEROVSKITE HALIDE OVERCOATING AND STABILIZATION

The United States Government claims certain rights in this invention pursuant to Contract No. W-31-109-ENG-38 between the United States Government and the University of Chicago and/or pursuant to DE-AC02-06CH11357 between the United States Government and UChicago Argonne, LLC representing Argonne National Laboratory.

TECHNICAL FIELD

The present disclosure relates generally to coatings and methods of forming coatings for protecting surfaces.

BACKGROUND

Organic-inorganic hybrid perovskite materials such as perovskite halides have emerged as one of the most promising light absorbers due to their superior optoelectronic properties. Hybrid perovskites based photovoltaics outperform a significant number of the currently mature photovoltaic technologies and can provide power conversion efficiencies of greater than 20%. They have tunable bandgap, experience rapid dissociation of carriers at room temperature, exhibit high carrier mobility and can absorb lights having wavelengths in the entire visible spectrum.

For photovoltaic devices, in particular, an important prerequisite is the long term stability against ambient moisture and temperature. An intrinsic challenge in device application of hybrid perovskites, however, is the long-term stability. The presence of a hygroscopic ionic small molecules, (i.e. alkylammonium cations), has been identified as the culprit for the sensitive nature of hybrid perovskites towards moisture and temperature, particularly to relative humidity (RH) above 35% RH and temperatures above 150 degrees Celsius or 200 degrees Celsius (depending on the particular perovskite halide), respectively. This has prevented the widespread use of the hybrid perovskites in devices such as solar cells, LEDs and other applications.

SUMMARY

Embodiments described herein relate generally to methods of coating perovskite halide films with a protective film using non-hydrolytic chemical vapor deposition, and in particular to non-hydrolytic atomic layer deposition (ALD) of a metal oxide film on perovskite halide films which protects the perovskite halide films from being degraded by exposure to moisture greater than 35% RH and temperatures of greater than 150 degrees Celsius, respectively.

In some embodiments, a method of protecting a perovskite halide film from moisture and temperature includes positioning the perovskite halide film in a chamber. The chamber is maintained at a temperature of less than 200 degrees Celsius. An organo-metal compound is inserted into the chamber. A non-hydrolytic oxygen source is subsequently inserted into the chamber. The inserting of the organo-metal compound and subsequent inserting of the non-hydrolytic oxygen source into the chamber is repeated for a predetermined number of cycles. The non-hydrolytic oxygen source and the organo-metal compound interact in the chamber to deposit a non-hydrolytic metal oxide film on the perovskite halide film. The non-hydrolytic metal oxide film protects the perovskite halide film from relative humidity of greater than 35% and a temperature of greater than 150 degrees Celsius, respectively.

In some embodiments, a method of fabricating a photovoltaic cell includes depositing a perovskite halide film on a substrate. The substrate is positioned in a chamber. The chamber is maintained at a temperature of less than 200 degrees Celsius. A titanium isopropoxide gas is inserted into the chamber. A non-hydrolytic oxygen source is subsequently inserted into the chamber. The inserting of the titanium isopropoxide gas and subsequent inserting of the non-hydrolytic oxygen source into the chamber is repeated for a predetermined number of cycles. The non-hydrolytic oxygen source and the titanium isopropoxide gas interact in the chamber to deposit a non-hydrolytic titanium dioxide film on the perovskite halide film. The non-hydrolytic titanium dioxide film protects the perovskite halide film from relative humidity of greater than 35% and a temperature of greater than 150 degrees Celsius. Moreover, the non-hydrolytic titanium dioxide film transports charges created in the perovskite halide film to an electrode in contact with the non-hydrolytic titanium dioxide film.

In some embodiments, a photovoltaic device includes a substrate. A conductive film is positioned on the substrate. A semiconducting film is deposited on the conductive film. A perovskite halide film is positioned on the semiconducting film, and a metal oxide film is positioned on the perovskite halide film. The metal oxide film protects the metal perovskite halide film from relative humidity of greater than 35% and a temperature of greater than 150 degrees Celsius, respectively.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

FIG. 4 panels (B), (C), and (D) show various $MAPbI_{3-x}Cl$ films deposited on substrates exposed to: ozone ($O_3$) (panel (B)), water ($H_2O$), (panel (C)) and acetic acid (panel (D)), respectively; FIG. 4 panel (E) is an x-ray diffraction (XRD) spectra of the various $MAPbI_{3-x}Cl$ films of FIG. 4, panels (A)-(D).

Figure 1:
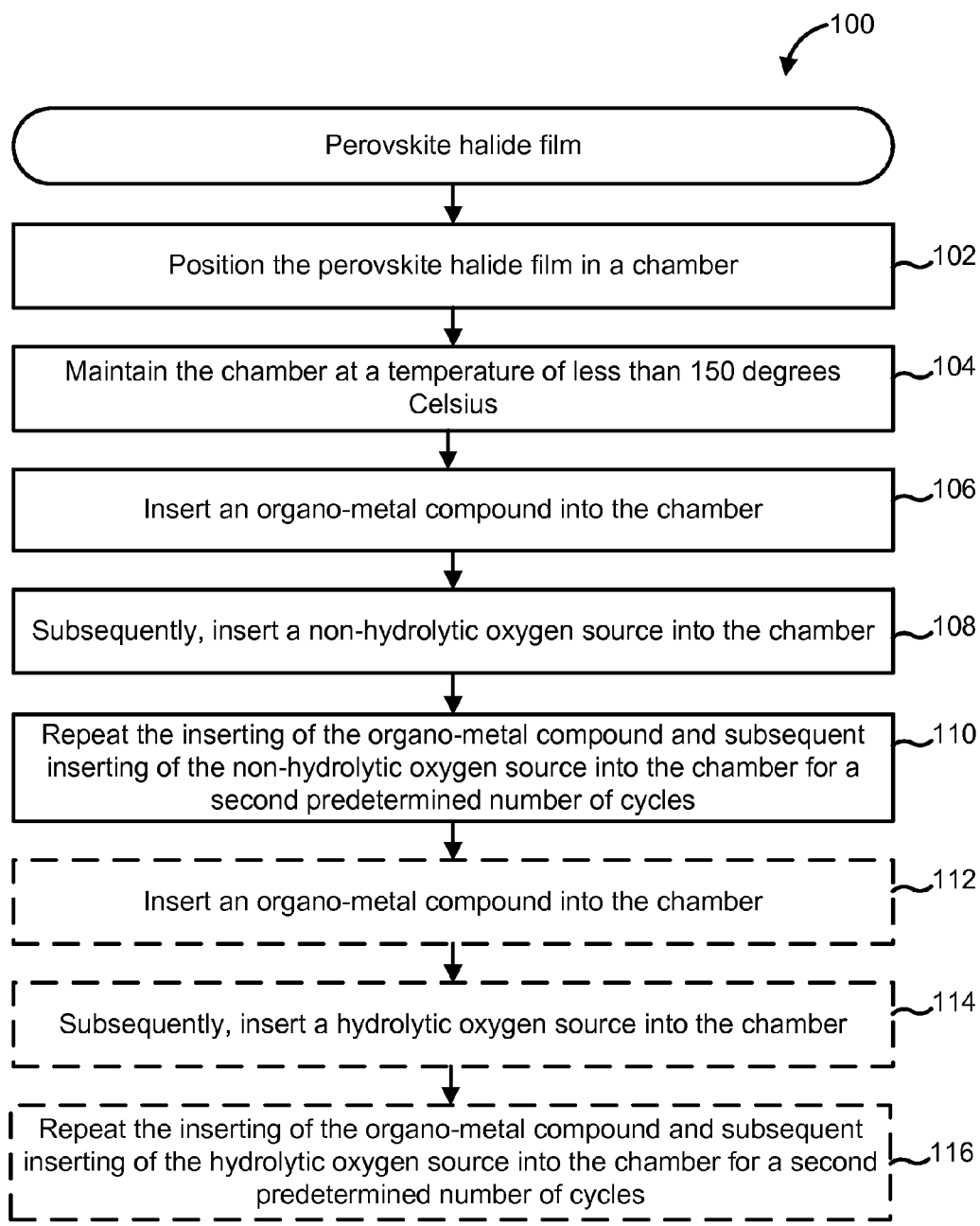
FIG. 1 is schematic flow diagram of an exemplary method for depositing a non-hydrolytic metal oxide film on a perovskite halide film to protect the perovskite halide film from degradation due to moisture and a temperature of greater than 35% RH and 150 degrees Celsius, respectively.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

Embodiments described herein relate generally to methods of coating perovskite halide films with a protective film using non-hydrolytic chemical vapor deposition, and in particular to non-hydrolytic atomic layer deposition (ALD) of a metal oxide film on perovskite halide films which protect the perovskite halide films from being degraded by exposure to moisture and temperatures of greater than 35% RH and 150 degrees Celsius, respectively.

Atomic layer deposition (ALD) is a chemically diverse vapor-phase deposition technique with the capability to synthesize ultra-thin and pinhole-free films, for example oxide barriers, with well-defined surface chemical control and precise physical thickness. While ALD is essentially a chemical vapor deposition (CVD), it is unique in that it can allow very high control for deposition of extremely thin layers (e.g., less than 1 nm thick layers) on the substrate. One or more precursors, for example gaseous precursors are inserted sequentially into the ALD chamber. The precursors interact in the ALD chamber to layer-by-layer deposit a film, layer or otherwise coating (e.g., a metal oxide such as $Al_2O_3$ or $TiO_2$) on the substrate positioned in the ALD chamber over numerous insertion cycles.

Typical ALD processes however, involve water ($H_2O$) or ozone ($O_3$) as oxygen sources in conjunction with relatively high temperatures (e.g., temperatures greater than 150 degrees Celsius). The water is a hydrolytic precursor which degrades perovskite halide films which may be positioned on the substrate. While ozone is not a hydrolytic precursor, it also degrades perovskite halide films and is therefore defined herein as a hydrolytic source. Therefore, such ALD processes cannot be used to deposit metal oxide films on the perovskite halide surfaces which can be used as protective films to shield the perovskite halide films from moisture and temperature, without causing damage during the deposition process to the perovskite halide surface.

Embodiments of the methods for coating perovskite halide films with non-hydrolytic metal oxide films may provide benefits including, for example: (1) depositing the non-hydrolytic metal oxide film using a non-hydrolytic oxygen source on perovskite halide films, which does not degrade the perovskite halide film as is the case when a hydrolytic oxygen source is used; (2) providing protection of the perovskite halide film from moisture and temperatures of greater than 35% RH and 150 degrees Celsius, respectively by coating the perovskite halide film with the non-hydrolytic metal oxide film; (3) enabling deposition of a hybrid-metal oxide film which can be deposited more rapidly than a non-hydrolytic metal oxide film allowing thicker coatings to be deposited more rapidly and more efficiently; (4) enabling fabrication of moisture and temperature stable perovskite halide photovoltaic (PV) cells which have a relatively high PV efficiency (e.g., a PV efficiency of greater than 12%); (5) depositing $nh-TiO_2$ coating on the perovskite halide films of PV cells which allows efficient transport of electrons from the perovskite halide films to an electrode, while protecting the perovskite halide films from moisture and temperature; and (6) improving subsequent processing compatibility (e.g., processing environment, chemical compatibility, stability and operational lifetime).

As used herein, the term "non-hydrolytic film" refers to a film which is formed using precursors which do not include water. Similarly, the term "hydrolytic film" refers to a film which is formed using a process which involves water, or any other source which contributes water.

As used herein, the term "non-hydrolytic precursor" is used to refer to a molecule or compound that does not damage perovskite halide films, e.g., carboxylic acids. Similarly, the term "hydrolytic precursor" is used to refer to a molecule or compound that damages perovskite halide films, e.g., water or ozone.

FIG. 1 is a schematic flow diagram of an exemplary method 100 for coating a perovskite halide film with an ultrathin protective barrier or otherwise coating which protects the perovskite halide film or otherwise surface from moisture and/or temperature of greater than 35% RH and 150 degrees Celsius, respectively. The perovskite halide film can be included in any device, for example a photovoltaic device, a laser, a detector, etc.

The perovskite halide film can be deposited on a substrate, for example a silicon, glass, transparent conducting oxides, quartz, sapphire, fused silica, silicon oxide, cubic zirconia, diamond, metal, a flexible substrate (e.g., polyethylene terephthalate (PET)) or any other suitable substrate. The perovskite halide film can have any suitable thickness. As described before, the perovskite halide film is a light absorber, and responds to visible light (e.g., sun-light) to generate electricity. The perovskite halide film can include a compound of formula I:

$$ABX_3 \qquad (I)$$

where,
  A is organic or inorganic cation,
  B is a metal cation, and
  X is a halide.

In particular embodiments, the perovskite halide film includes a compound of formula (II):

$$ABY_{3-x}Z_x \qquad (II)$$

where,
  A is methylammonium ($CH_3NH_3$) or formamidinium,
  B is Pb or Sn,
  Y is I, Cl or Br,
  Z is I, Cl or Br, and
  x is 0, 1, 2 or 3.

In particular embodiments, the perovskite halide film includes $CH_3NH_3PbI_{3-x}Cl_x$ (abbreviated as "$MAPbI_{3-x}Cl_x$" hereinafter). The perovskite halide film can be deposited on the substrate using any suitable process. For example, the perovskite halide film can be spin coated, spray coated or dip coated on the substrate (e.g., precursor solution of the perovskite halide film can be spin coated on the substrate to form the perovskite halide film through annealing), vapor deposited or evaporated on the substrate.

The method 100 includes positioning the perovskite halide film in a chamber at 102. For example, the perovskite halide film disposed on the substrate is positioned in an ALD chamber which can be pumped to a suitably low pressure (10-1000 mTorr). The chamber is maintained at a temperature of less than 200 degrees Celsius at 104. In various embodiments, the perovskite halide film can be thermally stable up to a first temperature, for example a temperature of up to about 150 degrees Celsius. In such embodiments, the chamber can be maintained at a temperature less than the first temperature, for example less than 150 degrees Celsius. For example, the chamber is maintained at a temperature in the range of 50 degrees Celsius to less than 200 degrees Celsius (e.g., 50, 60, 70, 80, 90, 100, 110, 120, 130, 140, 150, 160, 170, 180, 190, or 199 degrees Celsius inclusive of all ranges and values therebetween). As described before, perovskite halide films are susceptible to degradation at temperatures above 200 degrees Celsius. Maintaining the temperature of the chamber below 200 degrees Celsius maintains the integrity of the perovskite halide film. In particular embodiments, for example when the perovskite halide includes $MAPbI_{3-x}Cl_x$, the chamber is maintained at a temperature of less than 150 degrees Celsius.

An organo-metal compound is inserted into the chamber at 106. The organo-metal compound can include aluminum isopropoxide, aluminum triisopropoxide, aluminum trichloride, titanium isopropoxide, titanium tetraisopropoxide, titanium tetrachloride, trimethylaluminum, dimethylaluminum isopropoxide, titanium phenyltriisopropoxide, titanocene dichloride, methyltitanium trichloride, methyltriisopropoxytitanium or any other suitable organo-metal. In one embodiment, the organo-metal compound includes aluminum isopropoxide so that the deposited non-hydrolytic metal oxide film includes nh-$Al_2O_3$, as described herein. In other embodiments, organo-metal compound includes titanium isopropoxide so that the deposited non-hydrolytic metal oxide film includes nh-$TiO_2$ as described herein.

The organo-metal compound can be inserted into the chamber (e.g., an ALD chamber) in the form of a gas, a mist or a vapor. In various embodiments, the organo-metal compound is delivered into the chamber under the pressure range of 0.1-10 Torr with pumping (continuous flow mode) or 0.1-400 Torr without pumping (quasi-static mode). In particular embodiments, the organo-metal compound is inserted first into the chamber multiple times, for example 2, 3, 4 or even more times to remove any physisorbed moisture or water from the surface of the perovskite halide film.

Subsequently, a non-hydrolytic oxygen source is inserted into the chamber at 108 The non-hydrolytic oxygen source does not contribute any moisture to the perovskite halide film which can degrade the perovskite halide (as described in further detail with respect to FIG. 4). In particular embodiments, the non-hydrolytic oxygen source includes a carboxylic acid such as, for example, acetic acid, formic acid, propionic acid, butyric acid, valeric acid, caproic acid, enanthic acid, caprylic acid, pelargonic acid, capric acid, lauric acid, undecylic acid, tridecylic acid, myristic acid, pentadecanoic acid, palmitic acid, margaric acid, stearic acid, nonadecylic acid, arachidic acid or any other carboxylic acid. In one embodiment, the carboxylic acid includes acetic acid. In other embodiments, the non-hydrolytic oxygen source includes alcohols (e.g., isopropyl alcohol, tert-butyl alcohol, butyl alcohol, methanol, etc.), ethers (e.g., diisopropyl ether), ammonia, and/or glycols (e.g., ethylene glycol).

The non-hydrolytic oxygen source can be inserted into the chamber (e.g., an ALD chamber) in the form of a gas, a vapor or a mist. In various embodiments, the non-hydrolytic oxygen source is delivered into the chamber under the pressure range of 0.1-10 Torr with pumping (continuous flow mode) or 0.1-500 Torr without pumping (quasi-static mode).

The non-hydrolytic oxygen source and the organo-metal compound interact in the chamber to deposit a non-hydrolytic metal oxide film on the perovskite halide film which protects the perovskite halide film from moisture and a temperature of greater than 35% RH and 150 degrees Celsius, respectively. For example, the non-hydrolytic oxygen source can include a carboxylic acid which reacts with metal alkoxide on the surface through two reactions: i) replacement of alkoxy ligands with carboxylate groups under elimination of alcohol (A-1), and ii) esterification reaction producing hydroxyl groups (B-1). In the second reaction step, the organo-metal compound can include a metal alkoxide (e.g., a metal isopropoxide) which reacts with: i) hydroxylated surfaces under elimination of alcohol (A-2), and ii) carboxylate surface species react with alkoxide under elimination of ester (B-2). The reactions are summarized as follows:

  (A-1)

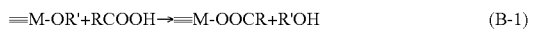  (B-1)

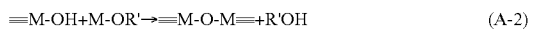  (A-2)

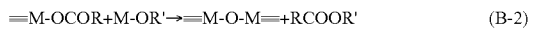  (B-2)

where M-OR' is the metal alkoxide, RCOOH is the carboxylic acid, and M-O-M is the metal oxide.

The insertion of the organo-metal compound and the subsequent insertion of the non-hydrolytic oxygen source into the chamber is repeated for a predetermined number of cycles at 110. For example, the insertion of the organo-metal compound and the subsequent insertion of the non-hydrolytic oxygen source into the chamber can be repeated for 1 cycle, 5 cycles, 10 cycles, 20 cycles, 50 cycles, 100 cycles, 200 cycles, 300 cycles, 400 cycles or 500 cycles inclusive of all ranges and values therebetween, or an even larger number of cycles. The number of cycles can be tuned to control the thickness of the non-hydrolytic metal oxide film on the perovskite halide film. For example, in various embodiments about 250 cycles are performed to deposit a 3 nm thick film of the non-hydrolytic metal oxide film (e.g. a nh-Al$_2$O$_3$ film, a nh-TiO$_2$ film, a non-hydrolytic zirconium oxide film, a non-hydrolytic hafnium oxide film, or a non-hydrolytic silicon oxide film).

The non-hydrolytic metal oxide can be uniform and pinhole free. The non-hydrolytic metal oxide film provides significant protection against moisture and a temperature of greater than 35% RH (e.g., 35%, 40%, 45%, 50%, 55%, 60%, 65%, 70%, 75%, 80%, 85%, 90%, 95% or 100% RH) and 150 degrees (e.g., 150, 175, 200, 225, 250, 275 or 300 degrees Celsius), respectively. In various embodiments, the thickness of the non-hydrolytic metal oxide film is defined so that the non-hydrolytic metal oxide film is sufficiently thin to allow greater than 90% of visible light incident on the non-hydrolytic metal oxide film to pass therethrough to the perovskite halide film positioned therebelow. In other words, the non-hydrolytic metal oxide film can have an optical transparency of greater than 90%.

In some embodiments, once a base non-hydrolytic metal oxide film is deposited on the perovskite halide film, a hydrolytic metal oxide film is then deposited on the non-hydrolytic metal oxide film. The rate of deposition of the hydrolytic metal oxide film can be faster than the non-hydrolytic metal oxide film which can allow for faster deposition of a thicker hydrolytic metal oxide film on the non-hydrolytic metal oxide film.

For example, an organo-metal compound is inserted into the chamber at 112. The organo-metal compound can include any of the organo-metal compounds described before herein, and can be inserted in the form of a gas, vapor or mist. In various embodiments, the organo-metal compound is delivered into the chamber under the pressure range of 0.1-10 Torr with pumping (continuous flow mode) or 0.1-400 Torr without pumping (quasi-static mode).

Subsequently, a hydrolytic oxygen source is inserted into the chamber at 114. The hydrolytic oxygen source can include, for example water or ozone. The hydrolytic oxygen source can be inserted into the chamber at pressure of 0.1-10 Torr with pumping (continuous flow mode) or 0.1-500 Torr without pumping (quasi-static mode). The base non-hydrolytic metal oxide film protects the perovskite halide film from the hydrolytic oxygen source which would otherwise degrade the perovskite halide film. The hydrolytic oxygen source and the organo-metal compound interact in the chamber to deposit a hydrolytic metal oxide (e.g., aluminum oxide or titanium oxide film) on the non-hydrolytic metal oxide film. In one embodiment, the organo-metal compound includes trimethylaluminum and the hydrolytic oxygen source includes ozone.

The hydrolytic metal oxide film is deposited much faster than the non-hydrolytic metal oxide film, for example 4 times faster, 5 times faster, 6 times faster, 7 times faster, 8 times faster, 9 times faster or 10 times faster. The inserting of the organo-metal compound and the hydrolytic oxygen source is repeated for a second predetermined number of cycles at 116. For example, the insertion of the organo-metal compound and the subsequent insertion of the hydrolytic oxygen source into the chamber can be repeated for 1, 2, 5, 10, 20, 50, 100, 200, 300, 400 or 500 insertion cycles, inclusive of all range and value therebetween, or even more until a desired thickness of the hydrolytic metal oxide film is obtained. In one embodiment, the inserting of the hydrolytic oxygen source and subsequent insertion of the organo-metal compound is performed for 250 cycles to deposit a 15-18 nm thick hydrolytic metal oxide film (e.g., hydrolytic Al$_2$O$_3$ film) on the non-hydrolytic metal oxide film, thereby forming a hybrid (hb) metal oxide film i.e., including both a non-hydrolytic and hydrolytic metal oxide film deposited on the perovskite halide film. In some embodiments, the deposition cycles of the non-hydrolytic metal oxide films and hydrolytic metal oxide films are alternated to deposit alternating layer of the non-hydrolytic and hydrolytic metal oxide films to obtain the hybrid metal oxide film (e.g., a hb-Al$_2$O$_3$ film).

Deposition of the thicker hybrid film on the perovskite halide film can provide better and long lasting protection against moisture and temperatures of greater than 35% RH and 150 degrees Celsius, respectively. In various embodiments, the non-hydrolytic metal oxide film and/or the hybrid metal oxide film can repair the surface of the perovskite halide, for example by filling the pinholes or micropores included in the perovskite halide film. This can reduce non-radiative recombination and therefore enhance the photoluminescence of the perovskite halide film.

Figure 2:
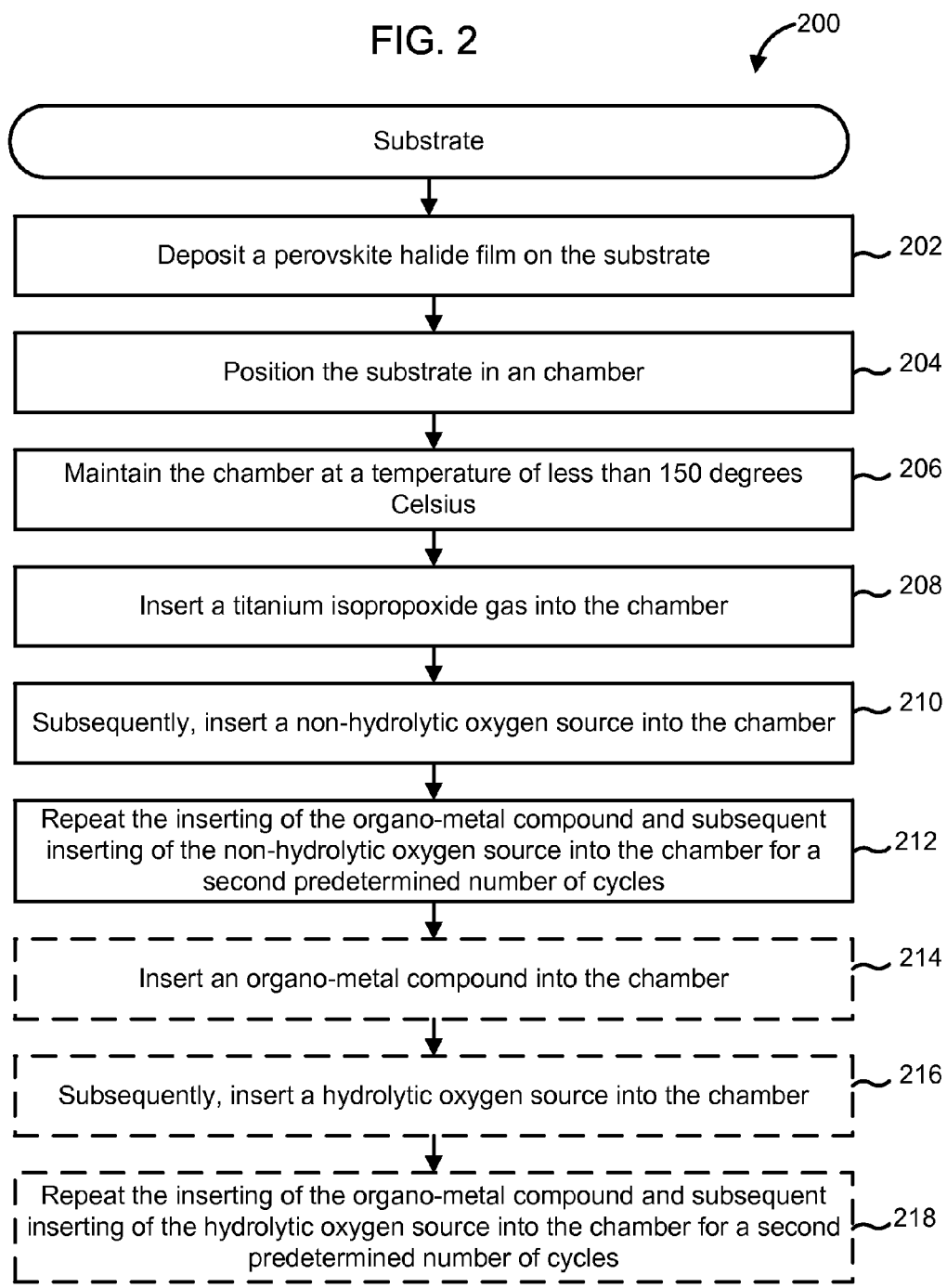
FIG. 2 is a schematic flow diagram of another exemplary method of fabricating a photovoltaic cell that includes a perovskite halide film coated with a non-hydrolytic titanium dioxide film which protects the perovskite halide film from moisture and a temperature of greater than 35% RH and 150 degrees Celsius, respectively, as well as transports charge created in the perovskite halide film to an electrode in contact with the non-hydrolytic titanium dioxide film.

FIG. 2 is a schematic flow diagram of an exemplary method 200 of fabricating a photovoltaic cell. The photovoltaic cell is prepared on a substrate, for example a silicon, glass, quartz, sapphire, fused silica, silicon oxide, cubic zirconia, diamond, metal, a flexible substrate (e.g., PET) or any other suitable substrate. In some embodiments, the substrate can include a conductive substrate, for example indium titanium oxide (ITO), or an electronically conductive film (e.g., an ITO film, a conductive metal or conductive metal film) can be positioned on the substrate to provide the conductive layer.

A perovskite halide film is deposited on the substrate at 202. The perovskite halide film can be deposited on the substrate using any suitable process. For example, the perovskite halide film can be spin coated, spray coated or dip coated on the substrate (e.g., precursor solution of the perovskite halide film can be spin coated on the substrate to form the perovskite halide film through annealing), vapor deposited or evaporated on the substrate.

The perovskite halide film can have any suitable thickness. As described before, the perovskite halide film is photovoltaic, and responds to visible light (e.g., sun-light) to generate electricity. The perovskite halide film can include a compound of formula I. In particular embodiments, the perovskite halide film includes the compound of formula II (e.g., $MAPbI_{3-x}Cl_x$) as described before herein.

The substrate is positioned in a chamber at 204. For example, the perovskite halide film disposed on the substrate is positioned in the chamber (e.g., an ALD chamber) which can be pumped to a suitably low pressure (10-1000 mTorr). The chamber is maintained at a temperature of less than 200 degrees Celsius at 206. For example, the chamber is maintained at a temperature in the range of 50 degrees Celsius to less than 200 degrees Celsius (e.g., 50, 60, 70, 80, 90, 100, 110, 120, 130, 140, 150, 160, 170, 180, 190, or 199 degrees Celsius inclusive of all ranges and values therebetween). As described before, some perovskite halide films are susceptible to degradation at temperatures above 200 degrees Celsius. Maintaining the temperature of the chamber below 200 degrees Celsius maintains the integrity of the perovskite halide film. Other perovskite halides (e.g., $MAPbI_{3-x}Cl_x$) may become unstable or are susceptible to degradation at temperatures above 150 degrees Celsius. In such implementations, the chamber is maintained at a temperature of less than 150 degrees Celsius.

A titanium isopropoxide gas is inserted into the chamber at 208. Subsequently, a non-hydrolytic oxygen source is inserted into the chamber at 210. The non-hydrolytic oxygen source does not contribute any moisture to the perovskite halide film which can degrade the perovskite halide (as described in further detail with respect to FIG. 4). In particular embodiments, the non-hydrolytic oxygen source includes a carboxylic acid such as, for example, acetic acid, formic acid, propionic acid, butyric acid, valeric acid, caproic acid, enanthic acid, caprylic acid, pelargonic acid, capric acid, lauric acid, undecylic acid, tridecyclic acid, myristic acid, pentadecanoic acid, palmitic acid, margaric acid, stearic acid, nonadecylic acid, arachidic acid or any other carboxylic acid. In one embodiment, the carboxylic acid includes acetic acid. In other embodiments, the non-hydrolytic oxygen source includes alcohols (e.g., isopropyl alcohol, tert-butyl alcohol, butyl alcohol, methanol, etc.), ethers (e.g., diisopropyl ether), ammonia, and/or glycols (e.g., ethylene glycol).

The non-hydrolytic oxygen source can be inserted into the chamber in the form of a gas, a vapor or a mist. In various embodiments, the titanium isopropoxide and/or the non-hydrolytic oxygen source are delivered into the chamber under the pressure range of 0.1-10 Torr with pumping (continuous flow mode) or 0.1-400 Torr without pumping (quasi-static mode).

The non-hydrolytic oxygen source and the titanium isopropoxide gas interact in the chamber to deposit a non-hydrolytic titanium oxide ($nh$-$TiO_2$) film on the perovskite halide film which protects the perovskite halide film from moisture and a temperature of greater than 35% RH and 150 degrees Celsius, respectively. Furthermore, the $nh$-$TiO_2$ film also transports charges created in the perovskite halide film to an electrode contacting the $nh$-$TiO_2$ film, thereby facilitating electron transfer.

The insertion of the non-hydrolytic oxygen source and the subsequent insertion of the titanium isopropoxide gas into the chamber (e.g., an ALD chamber) is repeated for a predetermined number of cycles at 212. For example, the insertion of the non-hydrolytic oxygen source and the subsequent insertion of the titanium isopropoxide gas into the chamber can be repeated for 1 cycle, 2 cycles, 5 cycles, 10 cycles, 20 cycles, 50 cycles, 100 cycles, 200 cycles, 300 cycles, 400 cycles or 500 cycles inclusive of all ranges and values therebetween, or an even higher number of cycles. The number of cycles can be tuned to control the thickness of the $nh$-$TiO_2$ film deposited on the perovskite halide film. For example, in various embodiments about 250 cycles are performed to deposit a 3 nm thick $nh$-$TiO_2$ film on the perovskite halide film. The $nh$-$TiO_2$ film provides significant protection against degradation of the perovskite halide film from moisture and a temperature of greater than 35% RH and 150 degrees, respectively. Furthermore, the $nh$-$TiO_2$ film quenches a photoluminescence of the perovskite halide film. The $nh$-$TiO_2$ can therefore be used to transport electrons from the perovskite halide film.

In some embodiments, a base $nh$-$TiO_2$ film can also be deposited below the perovskite halide film. For example, prior to depositing the perovskite halide film on the substrate, the substrate is positioned in the chamber. The titanium isopropoxide gas is inserted into the chamber; and subsequently the non-hydrolytic oxygen source is inserted into the chamber. The non-hydrolytic oxygen source and the titanium isopropoxide gas interact on the substrate to deposit a base $nh$-$TiO_2$ film on the substrate. In various embodiments, the $nh$-$TiO_2$ film can be coated above or below perovskite halide depending on the structure of photovoltaic cell (inverted or non-inverted). The $nh$-$TiO_2$ film allows electron transport from the perovskite halide film to an electrode in contact with the $nh$-$TiO_2$ film. In other embodiments, a hydrolytic oxygen source is used to deposit a hydrolytic-$TiO_2$ film on the substrate, over which the perovskite halide film is deposited.

In some embodiments, once the $nh$-$TiO_2$ film is deposited on the perovskite halide film, a hydrolytic metal oxide film is then deposited on the $nh$-$TiO_2$ film. For example, the rate of deposition of the hydrolytic metal oxide film (e.g., a hydrolytic $TiO_2$ film) can be faster than the $nh$-$TiO_2$ which can allow for faster deposition of a thicker hydrolytic metal oxide film on the $nh$-$TiO_2$ film.

For example, an organo-metal compound is inserted into the ALD chamber at 214. The organo-metal compound can include, for example, aluminum isopropoxide, aluminum triisopropoxide, aluminum trichloride, titanium isopropoxide, titanium tetraisopropoxide, titanium tetrachloride, trimethylaluminum, dimethylaluminum isopropoxide, titanium phenyltriisopropoxide, titanocene dichloride, methyltitanium trichloride, methyltriisopropoxytitaniumany or any other organo-metal compounds described before herein.

The organo-metal compound can be inserted in the form of a gas, vapor or mist. Subsequently, a hydrolytic oxygen source is inserted into the chamber at 216. The hydrolytic oxygen source can include, for example water or ozone. The $nh$-$TiO_2$ film predeposited on the perovskite halide protects the perovskite halide film from the hydrolytic oxygen source which would otherwise degrade the perovskite halide film. In various embodiments, the organo-metal compound and/or the hydrolytic oxygen source are delivered into the chamber under the pressure range of 0.1-10 Torr with pumping (continuous flow mode) or 0.1-400 Torr without pumping (quasi-static mode). The hydrolytic oxygen source and the organo-metal compound interact in the chamber to deposit a hydrolytic metal oxide (e.g., a hydrolytic aluminum oxide or titanium oxide film) on the nh-TiO$_2$ film. In one embodiment, the organo-metal compound includes TMA and the hydrolytic oxygen source includes O$_3$.

The hydrolytic metal oxide film is deposited much faster than the nh-TiO$_2$ film, for example 4 times faster, 5 times faster, 6 times faster, 7 times faster, 8 times faster, 9 times faster or 10 times faster. The inserting of organo-metal compound and subsequent inserting of the hydrolytic oxygen source into the chamber is repeated for a second predetermined number of cycles at 218. For example, 1, 2, 5, 10, 20, 50, 100, 200, 300, 400 or 500 insertion cycles are used, inclusive of all range and value therebetween, or an even higher number of cycles. In one embodiment, the inserting of the organo-metal compound and subsequent insertion of the hydrolytic oxygen source is performed for a predetermined number of cycles to deposit a predetermined thickness of hydrolytic metal oxide (e.g., hydrolytic Al$_2$O$_3$, TiO$_2$, ZnO) on the nh-TiO$_2$ film, thereby yielding a hybrid metal oxide film. The deposition cycles of the nh-TiO$_2$ film and the hydrolytic metal oxide film on the perovskite halide film can be alternated to deposit alternating layer of the nh-TiO$_2$ and the hydrolytic metal oxide to obtain the hybrid metal oxide film (e.g., a hb-TiO$_2$/Al$_2$O$_3$ film, or a hb-TiO$_2$ film).

Deposition of the thicker hybrid film on the perovskite halide film can provide better and long lasting protection against moisture and temperatures of greater than 35% RH and 150 degrees Celsius, respectively. In various embodiments, the nh-TiO$_2$ film and/or the hybrid metal oxide film can repair the surface of the perovskite halide, for example by filling the pinholes or micropores included in the perovskite halide film. This can reduce non-radiative recombination at defects in addition to the ability to transport charge to the electrode provided by the nh-TiO$_2$ film.

Figure 3:
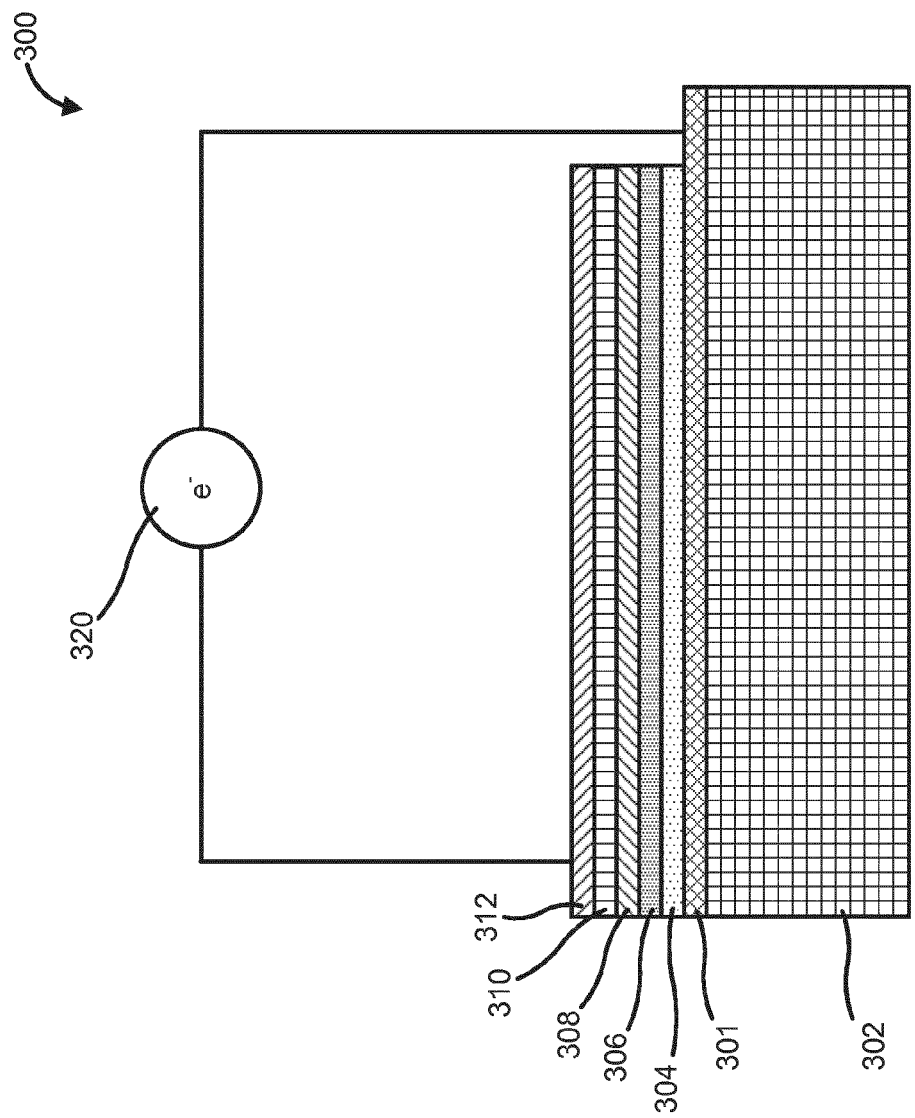
FIG. 3 is a schematic illustration of photovoltaic device that includes a perovskite halide film positioned on a substrate and coated with a non-hydrolytic metal oxide film.

FIG. 3 is a schematic illustration of a photovoltaic device 300, according to an embodiment. The photovoltaic device 300 can be used to generate electricity from sun light in the visible regime, and can have a high photoelectric conversion efficiency, for example up to about 25%. The photovoltaic device 300 can be used in solar cells for industrial power generation, consumer grid power generation, domestic power generation, in hybrid or electric vehicles, electric aircraft, watches, smart phones, computers, flash lights, flexible solar cells and/or LEDs or any other solar power generation application.

The photoelectric device 300 can include an inverted or a non-inverted photoelectric device. In one embodiment, the photoelectric device 300 is a non-inverted photovoltaic device. The non-inverted photovoltaic device 300 includes a substrate 302. The substrate 302 can include any suitable substrate, for example silicon, glass, quartz, sapphire, fused silica, silicon oxide, cubic zirconia, diamond, metal, a flexible substrate (e.g., PET) or any other suitable substrate. A conductive film 301 is positioned on the substrate 302. The conductive film 301 can include, for example a metal oxide film, an indium titanium oxide (ITO) film, a fluorine doped tin polymer (FTO) film, a conductive polymer film or any other suitable conductive film.

A semiconducting film 304 is deposited on the conductive film 301. The semi-conductive film can include a nh-TiO$_2$ film (e.g., a nh-TiO$_2$ film, a NiO film, a ZnO film, etc.) deposited on the substrate using the method 100, 200 or any other method described herein. In various embodiments, the semiconducting film includes a nh-TiO$_2$ film which can transport charges created in the perovskite halide film to the conducting film 301, as described before herein, to enable electronic communication therefrom.

A perovskite halide film 306 is positioned on the semiconducting film 304. The perovskite halide film 306 can include a compound of formula I as described before. In particular embodiments, the perovskite halide film 306 can include a compound of formula II:

$$ABY_{3-x}Z_x \qquad (II)$$

where,
A is methylammonium (CH$_3$NH$_3$) or formamidinium,
B is Pb or Sn,
Y is I, Cl or Br,
Z is I, Cl or Br, and
x is 0, 1, 2 or 3.

The perovskite halide film 306 can be deposited on the substrate using any suitable process. For example, the perovskite halide film can be spin coated, spray coated or dip coated on the substrate (e.g., precursor solution of the perovskite halide film can be spin coated on the substrate to form the perovskite halide film through annealing), vapor deposited or evaporated on the substrate.

A non-hydrolytic metal oxide film 308 is positioned on the perovskite halide film 306. The non-hydrolytic metal oxide film 308 protects the perovskite halide film 306 from moisture and a temperature of greater than 35% RH and 150 degrees, respectively. In various embodiments, the non-hydrolytic metal oxide film includes a nh-Al$_2$O$_3$ film or any other non-hydrolytic metal oxide film described herein. The non-hydrolytic metal oxide film 308 can be deposited on the perovskite halide using the method 100, 200 or any other suitable process described herein. In some embodiments, a hydrolytic metal oxide film can be deposited on the non-hydrolytic metal oxide film 308 to yield a hybrid metal oxide film (e.g., a hb-Al$_2$O$_3$ film). For example, a plurality of alternating layers of the non-hydrolytic metal oxide film and a hydrolytic metal oxide film can be deposited on the perovskite halide film 306, as described before herein with respect to the method 100 and 200.

In one embodiment, a hole transport layer 310 can optionally be deposited over the non-hydrolytic metal oxide film 308. The hole transport layer 310 can include, for example a NiO film, a spiro-OMeTAD film, a PEDOT:PSS film or any other a hole transport layer. Finally, an electrode 312 (e.g., a conducting metal) is positioned on (e.g., deposited on) and is in electrical communication with the non-hydrolytic metal oxide film 308 or the hole transport layer 310 deposited over the non-hydrolytic metal oxide film 308. The electrode 312 can be electronically coupled to an electronic device 320 which can, for example include a power storage unit (e.g., a rechargeable battery) for storing the electrical power produced by the perovskite halide film 306.

In another embodiment, the photovoltaic device 300 includes an inverted photovoltaic device. In such embodiments, the inverted photovoltaic device 300 includes a substrate 302. The substrate 302 can include any suitable substrate, for example silicon, glass, quartz, sapphire, fused silica, silicon oxide, cubic zirconia, diamond, metal, a flexible substrate (e.g., PET) or any other suitable substrate. A conductive film 301 is positioned on the substrate 302. The conductive film 301 can include, for example a metal oxide film, an indium titanium oxide (ITO) film, a fluorine doped tin polymer (FTO) film, a conductive polymer film or any other suitable conductive film. A semiconducting film 304 is deposited on the conductive film 301. The semi-conductive film can include a NiO film, a spiro-OMeTAD film, a PEDOT:PSS film, etc.).

A perovskite halide film 306 is positioned on the semiconducting film 304. The perovskite halide film 306 can include a compound of formula I as described before. In particular embodiments, the perovskite halide film 306 can include a compound of formula II as described before (e.g., a $MAPbI_{3-x}Cl_x$ film). The perovskite halide film 306 can be deposited on the substrate using any suitable process. For example, the perovskite halide film can be spin coated, spray coated or dip coated on the substrate (e.g., precursor solution of the perovskite halide film can be spin coated on the substrate to form the perovskite halide film through annealing), vapor deposited or evaporated on the substrate.

A $nh\text{-}TiO_2$ film 308 is positioned on the perovskite halide film 306. Finally, an electrode 312 (e.g., a conducting metal) is positioned on (e.g., deposited on) and is in electrical communication with the $nh\text{-}TiO_2$ film (the optional hole transport layer 310 shown in FIG. 3 is excluded in the inverted photovoltaic cell structure so that the $nh\text{-}TiO_2$ film is in contact with the electrode 312). The $nh\text{-}TiO_2$ film 308 protects the perovskite halide film 306 from moisture and a temperature of greater than 35% RH and 150 degrees, respectively, as well as transports charges created in the perovskite halide film 306 (e.g., from exposure to light) to the electrode 312 in contact with the $nh\text{-}TiO_2$ film. The electrode 312 can be electronically coupled to an electronic device 320 which can, for example include a power storage unit (e.g., a rechargeable battery) for storing the electrical power produced by the perovskite halide film 306.

The following examples show various examples of perovskite halide films coated with non-hydrolytic and/or hybrid metal oxide films and the optical properties thereof. These examples are only for illustrative purposes and are not intended to limit the scope of the present disclosure. Please note that while all the following examples are directed towards coating $MAPbI_{3-x}Cl_x$ films with non-hydrolytic and hybrid metal oxide films which are deposited in an ALD chamber, any other non-hydrolytic metal oxide film deposited using any other CVD process can be used for passivating $MAPbI_{3-x}Cl_x$ films, any other perovskite halide film or coating any other surface formed from any other material to protect the surface from moisture and temperature.

Experimental Examples

Mixed perovskite halide, $CH_3NH_3PbI_{3-x}Cl_x$ ($MAPbI_{3-x}Cl_x$), films were spin coated on glass substrates by one step process in nitrogen ($N_2$) filled glove box. A 1:3 molar ratio of $PbCl_2$ and $CH_3NH_3I$ (MAI) mixture was dissolved in anhydrous N,N-dimethylformamide (DMF). The solution was spin coated onto glass substrates followed by annealing at 100 degrees Celsius for 1 hour. A representative optical image of an as-deposited $MAPbI_{3-x}Cl_x$ is depicted in FIG. 4 panel (A). The samples exhibit single phase polycrystalline nature as verified by the XRD plot shown in FIG. 4 panel (E). The data confirms absence of perovskite halides of the form $CH_3NH_3PbI_2Cl$ or $CH_3NH_3PbICl_2$ as well as $PbI_2$ which is a product of decomposition of the $MAPbI_{3-x}Cl_x$ film, thereby revealing the pristine nature of the as deposited $MAPbI_{3-x}Cl_x$ film.

$Al_2O_3$ was chosen as a model overlayer material, owing to its good barrier properties and precedence for thin film passivation. The stability of $MAPbI_{3-x}Cl_x$ films was first examined at modest temperature under vacuum and under additional exposure to common ALD oxygen sources. As-deposited films $MAPbI_{3-x}Cl_x$, which were deposited using the spin coating process described before herein, were exposed to $O_3$ and $H_2O$ (ALD half reaction) in an ALD reactor at 100 degrees Celsius. The amount of precursor delivered into the chamber was chosen to reflect realistic $Al_2O_3$ synthesis conditions which includes 100 cycles of 0.015 second exposure to $H_2O$ and 100 cycles of 0.75 second exposure to $O_3$. As illustrated in FIG. 4 panel (B)), exposure to $O_3$ readily induces a visible degradation of the $MAPbI_{3-x}Cl_x$ films. On the basis of XRD results, the films decompose completely into $PbI_2$ along with a drastic loss of crystallinity (FIG. 4 panel (E)). As shown in FIG. 4 panel (C) $H_2O$ triggers a similar effect although subtle changes in optical contrast suggested the possibility of partial (incomplete) degradation. Indeed, XRD results indicated a significant formation of $PbI_2$ in the samples while largely retaining their initial crystallinity throughout the experiment (FIG. 4 panel (E)).

Figure 4:
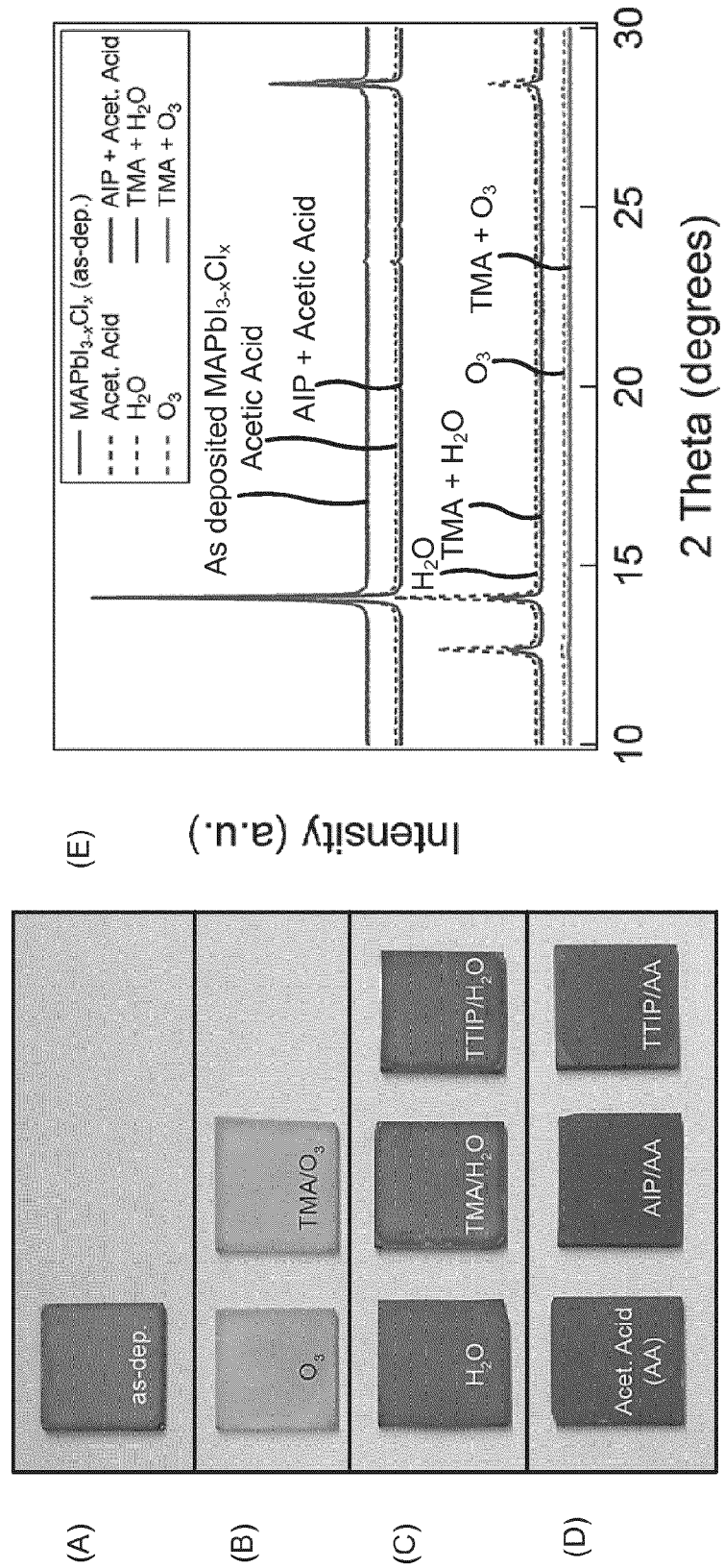
FIG. 4 panel (A) is a representative optical image of an as-deposited $CH_3NH_3PbI_{3-x}Cl_x$ (abbreviated as "$MAPbI_{3-x}Cl_x$") thin film on a substrate.
Figure 6:
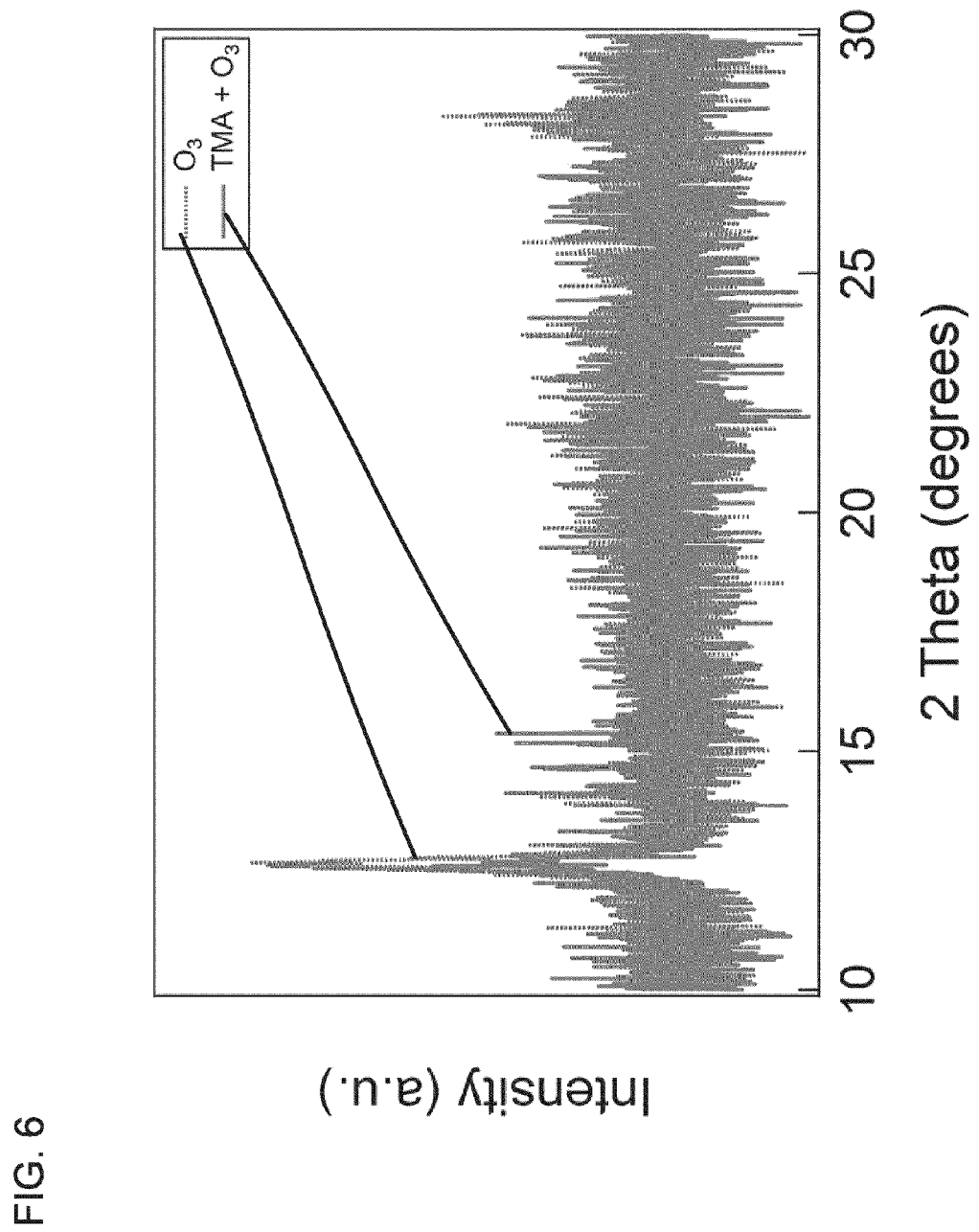
FIG. 6 is an XRD plot of a $MAPbI_{3-x}Cl_x$ film after exposure to $O_3$ alone and a mixture of trimethylaluminum (TMA) and $O_3$ demonstrating a loss in diffraction intensity which corresponds to a degradation or loss of crystal structure of the $MAPbI_{3-x}Cl_x$ film.

As illustrated in FIG. 4 panel (B), samples exposed to TMA and $O_3$ appear equally degraded to the naked eye. A closer look at the XRD data, however, revealed a larger loss of film crystallinity in samples exposed to TMA and $O_3$ as shown in FIG. 6. An analogous effect was observed with TMA with $H_2O$ and titanium tetraisopropoxide (TTIP) with $H_2O$ in FIG. 4 panel (C). In contrast to the samples exposed to $H_2O$ alone, changes in optical contrast became more apparent, which implies an accelerated process of degradation presumably attributed by the exothermic reaction between TMA and $H_2O$.

To avoid $O_3$ or $H_2O$ induced degradation, a non-hydrolytic ALD process, which involves metal isopropoxides (e.g. aluminum triisopropoxide, titanium tetraisopropoxide) and carboxylic acids (e.g. acetic acid, formic acid) as sources of metal and oxygen, respectively was adopted to circumvent the detrimental effects of the hydrolytic oxygen sources. As seen in FIG. 4 panel (D) $MAPbI_{3-x}Cl$ films exhibited remarkable resistance to acetic acid (AA). Samples remained single phase without noticeable loss of crystallinity (FIG. 4 panel (E)), which is corroborated by the unmodified optical contrast observed in FIG. 4 panel (D).

Figure 5:
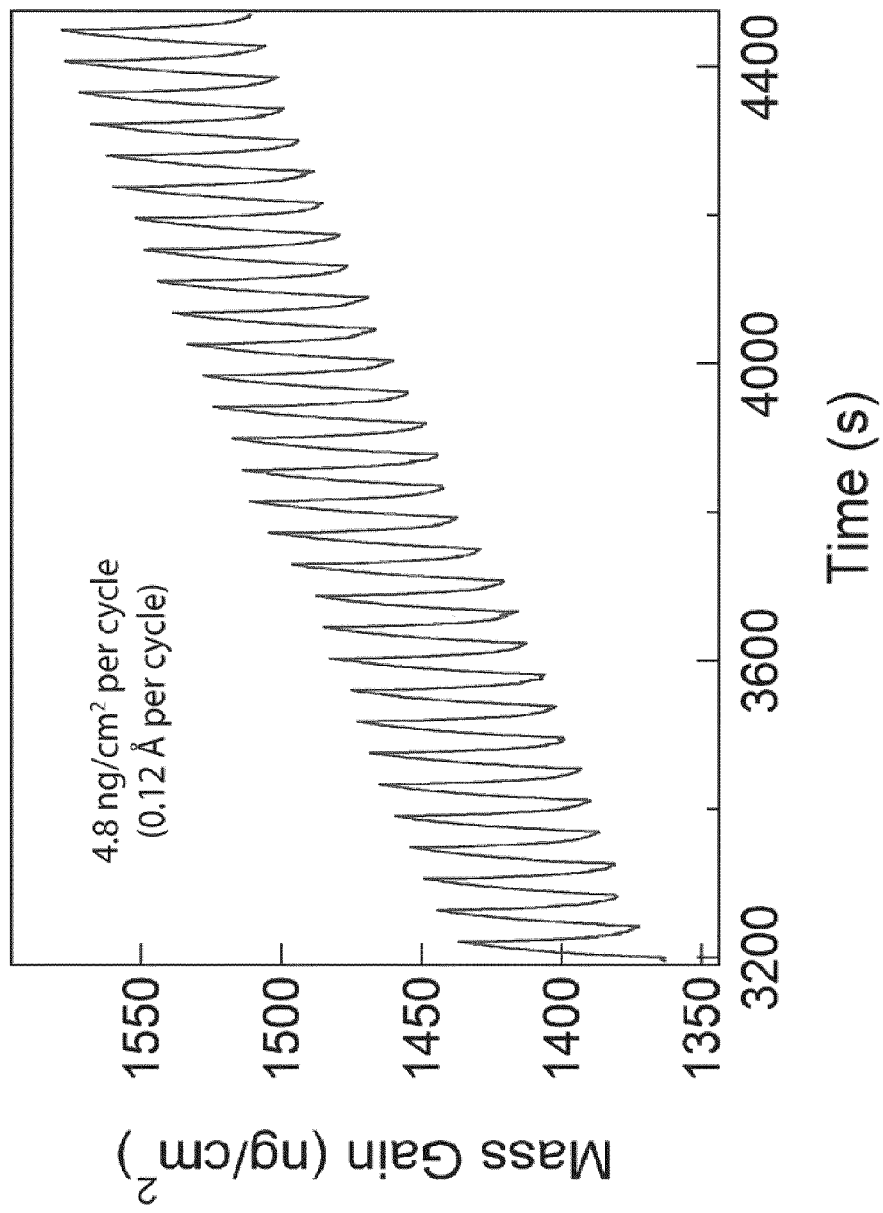
FIG. 5 is a plot of in-situ quartz crystal microbalance (QCM) data recorded in an ALD chamber of the mass gain of the $nh-Al_2O_3$ film being deposited on the $MAPbI_{3-x}Cl_x$ during 30 ALD cycles.

As shown in the plot of FIG. 5, at 100 degrees Celsius, the controlled growth of $nh\text{-}Al_2O_3$ occurs at about 0.1 angstrom per cycle. It was observed that $MAPbI_{3-x}Cl_x$ films exhibit remarkable resistance to at least 200×0.015 sec exposures of acetic acid (FIG. 4 panel (D)) at 100 degrees Celsius. The $MAPbI_{3-x}Cl$ perovskite halide remains single phase without visible transformation or measurable loss of crystallinity as revealed by XRD (FIG. 4 panel (E)).

Non-hydrolytic ALD full reactions were performed to deposit non-hydrolytic metal oxide films on the $MAPbI_{3-x}Cl$ perovskite halide film. Specifically a combination of aluminum isopropoxide (AIP) and acetic acid (AA) (abbreviated as AIP/AA) was used to deposit a $nh\text{-}Al_2O_3$ film on the $MAPbI_{3-x}Cl_x$ film. Furthermore, a combination of TTIP and AA (abbreviated as TTIP/AA) was used to deposit a $nh\text{-}TiO_2$ film on as-deposited $MAPbI_{3-x}Cl$ films. Visual observation did not indicate any significant degradation (FIG. 4 panel (D)). The XRD data revealed complete suppression of $PbI_2$ formation as well as preservation of initial crystallinity (FIG. 4 panel (E)), revealing that the $MAPbI_{3-x}Cl$ perovskite halide film suffers minimal or no degradation. This is in striking contrast to $TMA/O_3$ or $TMA/H_2O$ processes which cause significant degradation of the perovskite halide film, thus proving that the acetic acid is an effective non-hydrolytic oxygen source.

Figure 7:
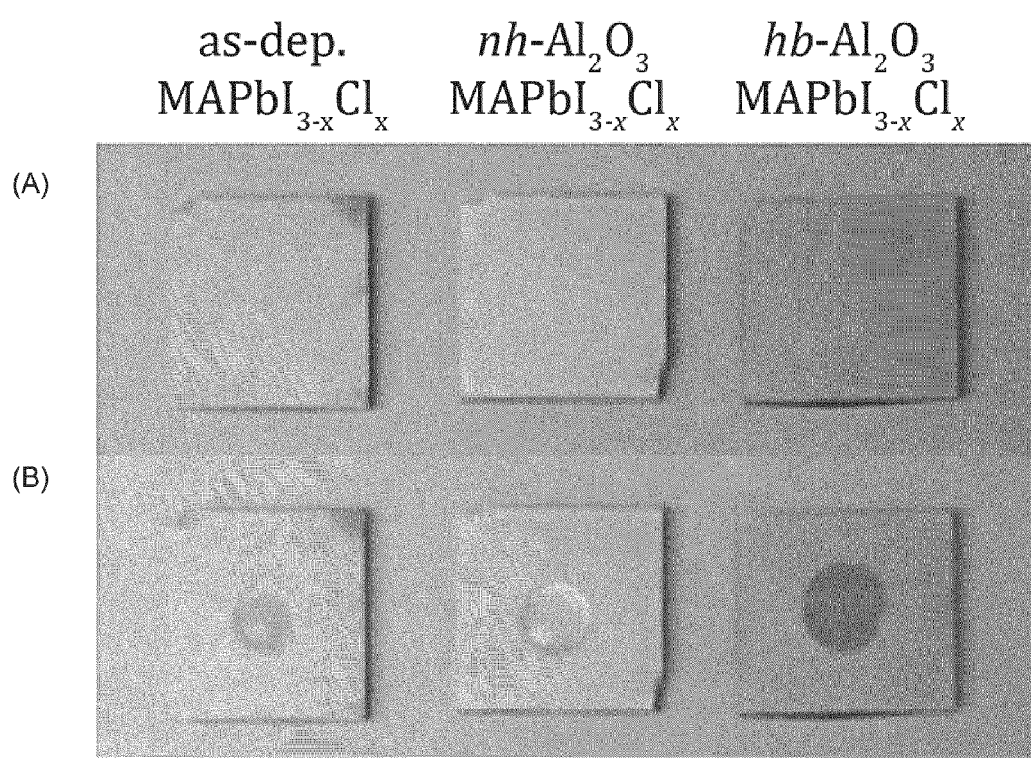
FIG. 7 panels (A) and (B) are optical images illustrating the effect of 5 μL water droplet on an as deposited $MAPbI_{3-x}Cl_x$ thin film, a $MAPbI_{3-x}Cl_x$ thin film coated with non-hydrolytic aluminum oxide ($nh-Al_2O_3$) film, and a $MAPbI_{3-x}Cl_x$ thin film coated with a hybrid aluminum oxide ($hb-Al_2O_3$) film, which includes alternating layers of $nh-Al_2O_3$ films and $hydrolytic-Al_2O_3$ films, after 0 seconds (panel (A)) and 120 seconds (panel (B)) of exposure to the water droplet.

To investigate barrier performance as a function of barrier thickness, three sets of samples were prepared shown in FIG. 7. The samples included: unpassivated $MAPbI_{3-x}Cl_x$, 3 nm thick $nh\text{-}Al_2O_3$ deposited on $MAPbI_{3-x}Cl_x$, and 18 nm thick $hb\text{-}Al_2O_3$ deposited on $MAPbI_{3-x}Cl_x$. The 3 nm nh-Al$_2$O$_3$ protective film was deposited on the MAPbI$_{3-x}$Cl$_x$ via 250 insertion cycles of AIP and AA. As described before, the hybrid non-hydrolytic films provide a significant faster deposition relative to the nh-Al$_2$O$_3$ deposition process (about 0.1 angstrom per cycle), as evidenced by the 18 nm hb-Al$_2$O$_3$ deposited on MAPbI$_{3-x}$Cl$_x$. The 18 nm hb-Al$_2$O$_3$ includes a 3 nm nh-Al$_2$O$_3$ film passivating the MAPbI$_{3-x}$Cl$_x$, which is overcoated with a 15 nm thick hydrolytic Al$_2$O$_3$ film. The hydrolytic Al$_2$O$_3$ film was deposited after only 250 cycles of TMA and H$_2$O on the nh-Al$_2$O$_3$ already deposited on the MAPbI$_{3-x}$Cl$_x$ film.

Subsequently, 5 µL of water was drop casted onto the three sets of samples. FIG. 7 panels (A)-(B) are optical images of MAPbI$_{3-x}$Cl$_x$ films outlining the process of degradation at 0 seconds (panel (A), and 120 seconds (B) after disposing the water droplet on the as deposited MAPbI$_{3-x}$Cl film, and the MAPbI$_{3-x}$Cl films coated with nh-Al$_2$O$_3$ and hb-Al$_2$O$_3$. As expected, unpassivated MAPbI$_{3-x}$Cl$_x$ film degrades instantaneously in contact with water. A 3 nm nh-Al$_2$O$_3$ passivated MAPbI$_{3-x}$Cl$_x$ film breaks down slower than the uncoated MAPbI$_{3-x}$Cl$_x$ film. It is perceived that a thicker nh-Al$_2$O$_3$ would provide better protection and last longer. An 18 nm hb-Al$_2$O$_3$ passivation, on the other hand, indicates marked improvement over the uncoated MAPbI$_{3-x}$Cl film and the 3 nm nh-Al$_2$O$_3$ passivated MAPbI$_{3-x}$Cl film.

Figure 8:
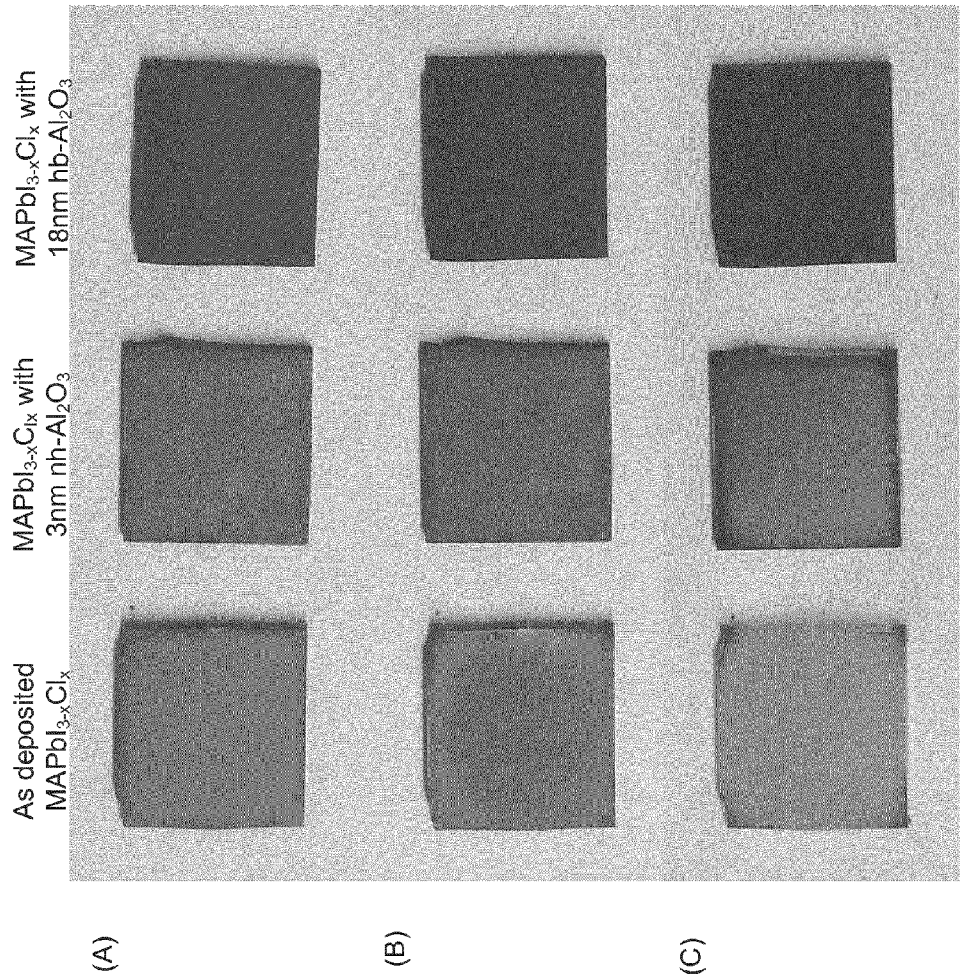
FIG. 8 panels (A), (B) and (C) are optical images of an as deposited $MAPbI_{3-x}Cl_x$ thin film, an $MAPbI_{3-x}Cl_x$ thin film with a 3 nm $nh-Al_2O_3$ film, and a 18 nm $hb-Al_2O_3$ film deposited on a $MAPbI_{3-x}Cl_x$ thin film after exposure to 85% RH for 0 hours (panel (A)), 6 hours (panel (B)) and 48 hours (panel (C)), respectively.

The effect of water droplet is drastically severe relative to exposure to moisture, and is rarely expected to happen in a real world setting as solar cells are generally enclosed in enclosures (e.g., glass or Plexiglas) which prevents water droplets from directly contacting the solar cell surface. Thus, performance of the Al$_2$O$_3$ protective coatings was examined in a more realistic environment having RH of 85%. As shown in FIG. 8 panels (A) to (C), while as-deposited MAPbI$_{3-x}$Cl film almost fully decomposes in less than 12 hours, the 3 nm nh-Al$_2$O$_3$ and 18 nm hb-Al$_2$O$_3$ passivated MAPbI$_{3-x}$Cl films remain stable for 6 hours, and over 200 hours, respectively exhibiting an unprecedented stability against moisture. In particular, the 18 nm hb-Al$_2$O$_3$ passivated MAPbI$_{3-x}$Cl$_x$ film exhibits demonstrated stability for more than 3 weeks, thus demonstrating a more than an order of magnitude improvement in moisture resistance over the unpassivated MAPbI$_{3-x}$Cl$_x$ film.

Figure 9:
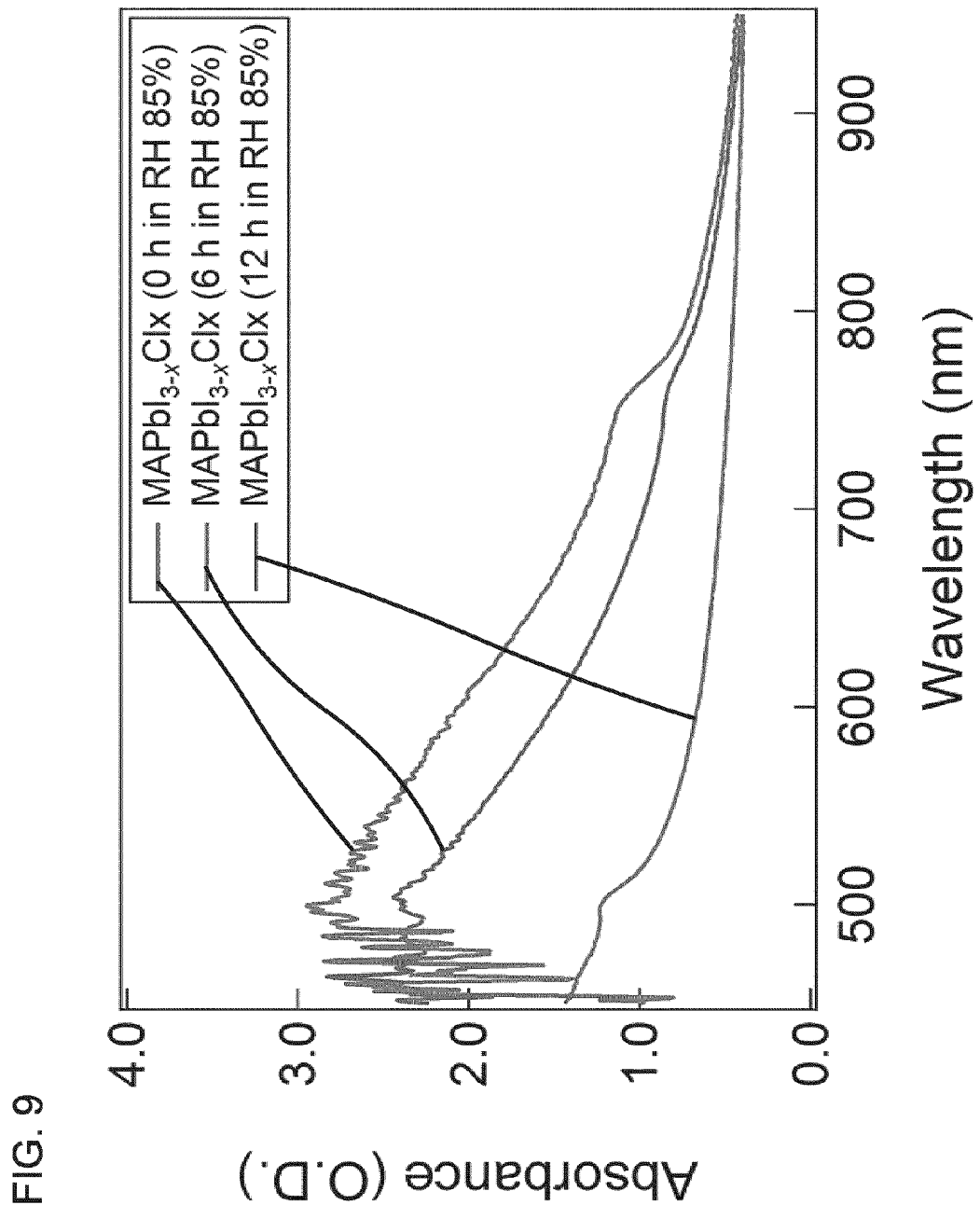
FIG. 9 is a plot of a UV-vis spectra of $MAPbI_{3-x}Cl_x$ films exposed to 85% RH as a function of time illustrating the degradation of the $MAPbI_{3-x}Cl_x$ films due to the moisture.

Referring to FIG. 9, optical assessment of film degradation was further verified with UV-vis spectroscopy and XRD throughout the degradation process in RH 85%, which revealed gradual formation of PbI$_2$ in the unpassivated film. The 3 nm nh-Al$_2$O$_3$ passivated MAPbI$_{3-x}$Cl$_x$ film degrades over prolonged exposure to RH 85%, the 18 nm hb-Al$_2$O$_3$ passivated MAPbI$_{3-x}$Cl$_x$ do not visibly degrade even after more than 3 weeks of exposure to RH 85%. Furthermore, as MAPbI$_{3-x}$Cl exhibits inherent tolerance to low levels of humidity (about RH 20%), the ultrathin barriers of nh-Al$_2$O$_3$ or hb-Al$_2$O$_3$ are sufficient to achieve long-term stability, especially, if coupled with device encapsulation.

Figure 10:
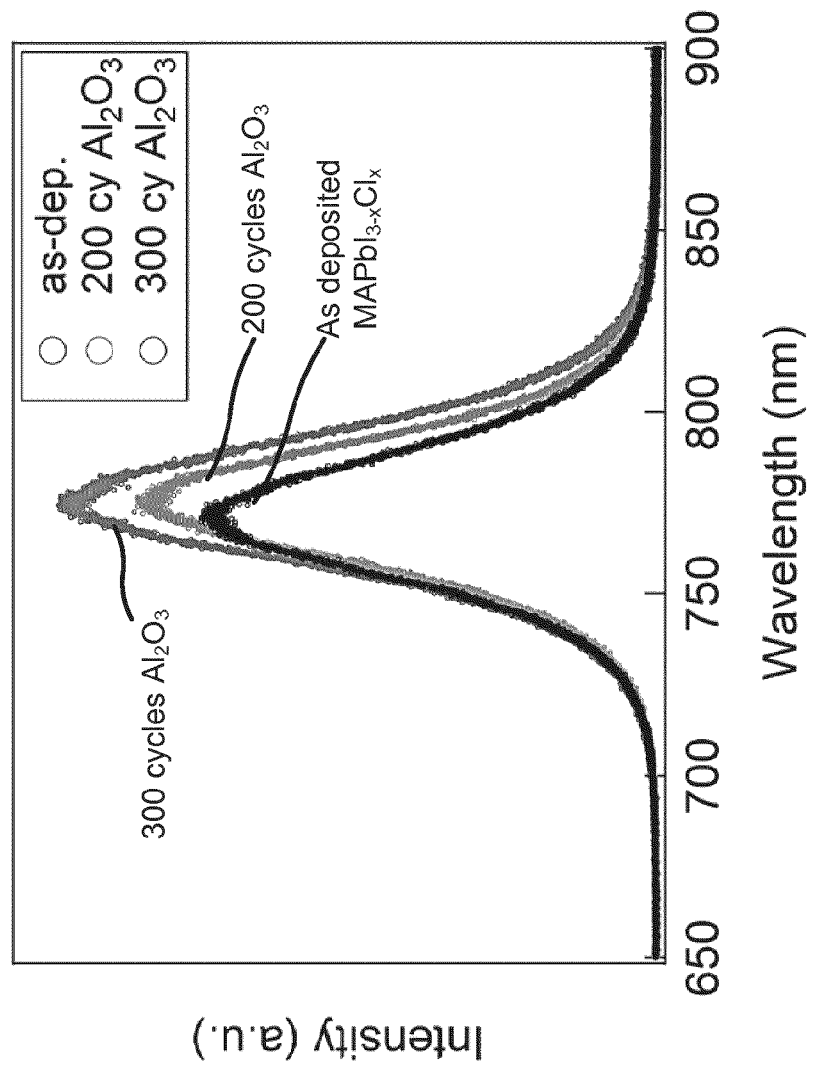
FIG. 10 is a plot of photoluminescence (PL) of an as deposited $MAPbI_{3-x}Cl_x$ thin film, a $MAPbI_{3-x}Cl_x$ thin film coated with $nh-Al_2O_3$ deposited for 200 cycles in an ALD chamber, and a $MAPbI_{3-x}Cl_x$ thin film coated with $nh-Al_2O_3$ deposited for 300 cycles in the ALD chamber demonstrating surface repair through $nh-Al_2O_3$ films on the perovskite halide film.

In various embodiments, deposition of non-hydrolytic metal oxide film (e.g., a nh-Al$_2$O$_3$ or hb-Al$_2$O$_3$ film) may also inhibit non-radiative recombination and improve the photoelectric conversion efficiency of the perovskite halide films (e.g., MAPbI$_{3-x}$Cl$_x$ films). For example, the deposited non-hydrolytic metal oxide coating or hybrid metal oxide coating can repair pinholes or otherwise surface imperfections of the perovskite halide films which can inhibit non-radiative recombination or otherwise electron transfer of the perovskite halide film. FIG. 10 is a plot of PL intensity of an as deposited MAPbI$_{3-x}$Cl film, a MAPbI$_{3-x}$Cl film coated with a nh-Al$_2$O$_3$ deposited via 200 ALD cycles and another MAPbI$_{3-x}$Cl$_x$ film coated with a nh-Al$_2$O$_3$ film deposited via 300 ALD cycles. The 200 cycles ALD nh-Al$_2$O$_3$ film and the 300 cycles ALD nh-Al$_2$O$_3$ films exhibited a significant increase in PL intensity of the MAPbI$_{3-x}$Cl$_x$ film, relative to the un-passivated or uncoated MAPbI$_{3-x}$Cl$_x$ film.

Passivation or coating of perovskite halide films with non-hydrolytic or hybrid metal oxide films (e.g., nh-Al$_2$O$_3$ or hb-Al$_2$O$_3$) significantly improves thermal stability of the perovskite halide (e.g., MAPbI$_{3-x}$Cl$_x$) films. To demonstrate the protective properties of the non-hydrolytic and hybrid metal oxide coating towards perovskite halide films against temperature, an uncoated MAPbI$_{3-x}$Cl film, a MAPbI$_{3-x}$Cl film coated with a 3 nm thick nh-Al$_2$O$_3$ film, and a MAPbI$_{3-x}$Cl film coated with an 18 nm thick hb-Al$_2$O$_3$ film were heated to a temperature of 250 degrees Celsius. Heating was performed on a hotplate in a nitrogen filled glove box with water and oxygen levels below 0.1 ppm.

Figure 11:
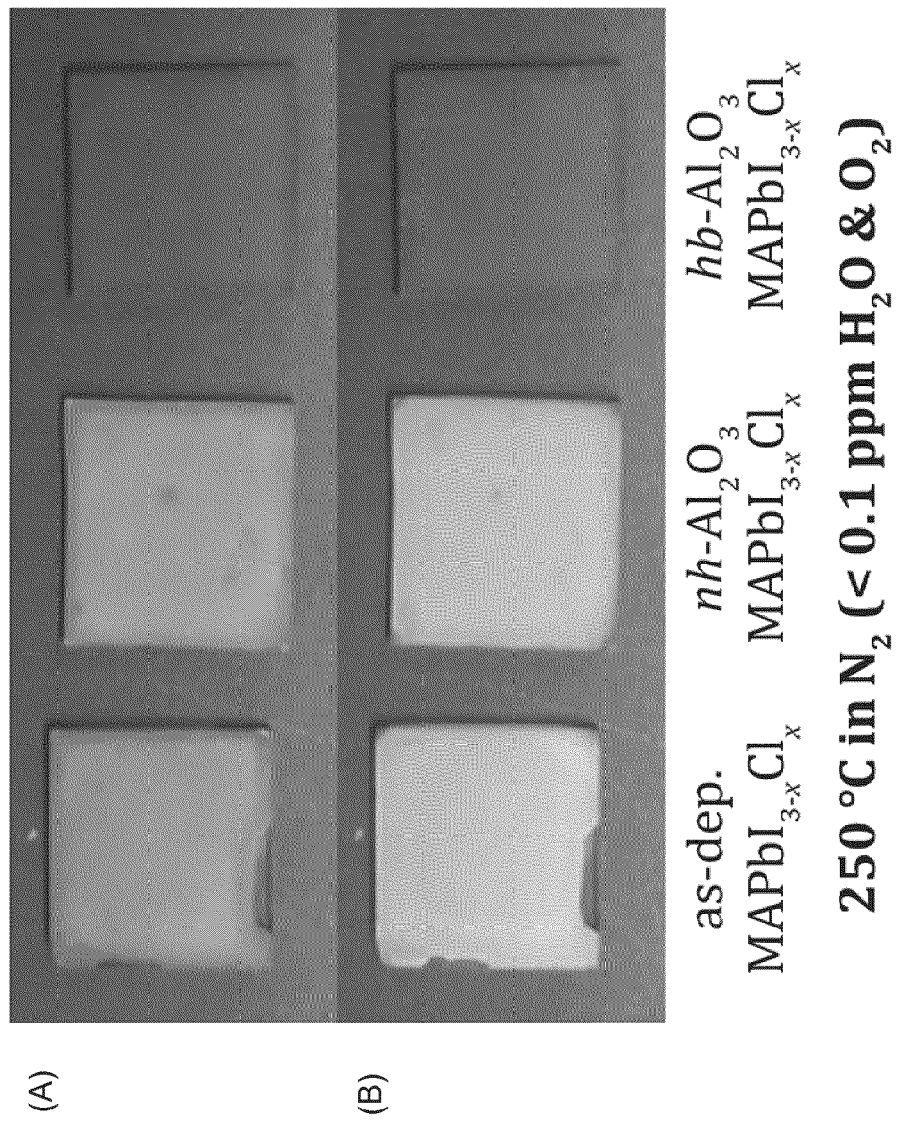
FIG. 11 panels (A) and (B) are optical images of an as deposited $MAPbI_{3-x}Cl_x$ film, a $MAPbI_{3-x}Cl_x$ film coated with a 3 nm $nh-Al_2O_3$ film, and a $MAPbI_{3-x}Cl_x$ film coated with a 18 nm $hb-Al_2O_3$ film after heating on a hotplate at 250 degrees Celsius in a nitrogen ($N_2$) filled glove box at 0 seconds and after 150 seconds, respectively.
Figure 12:
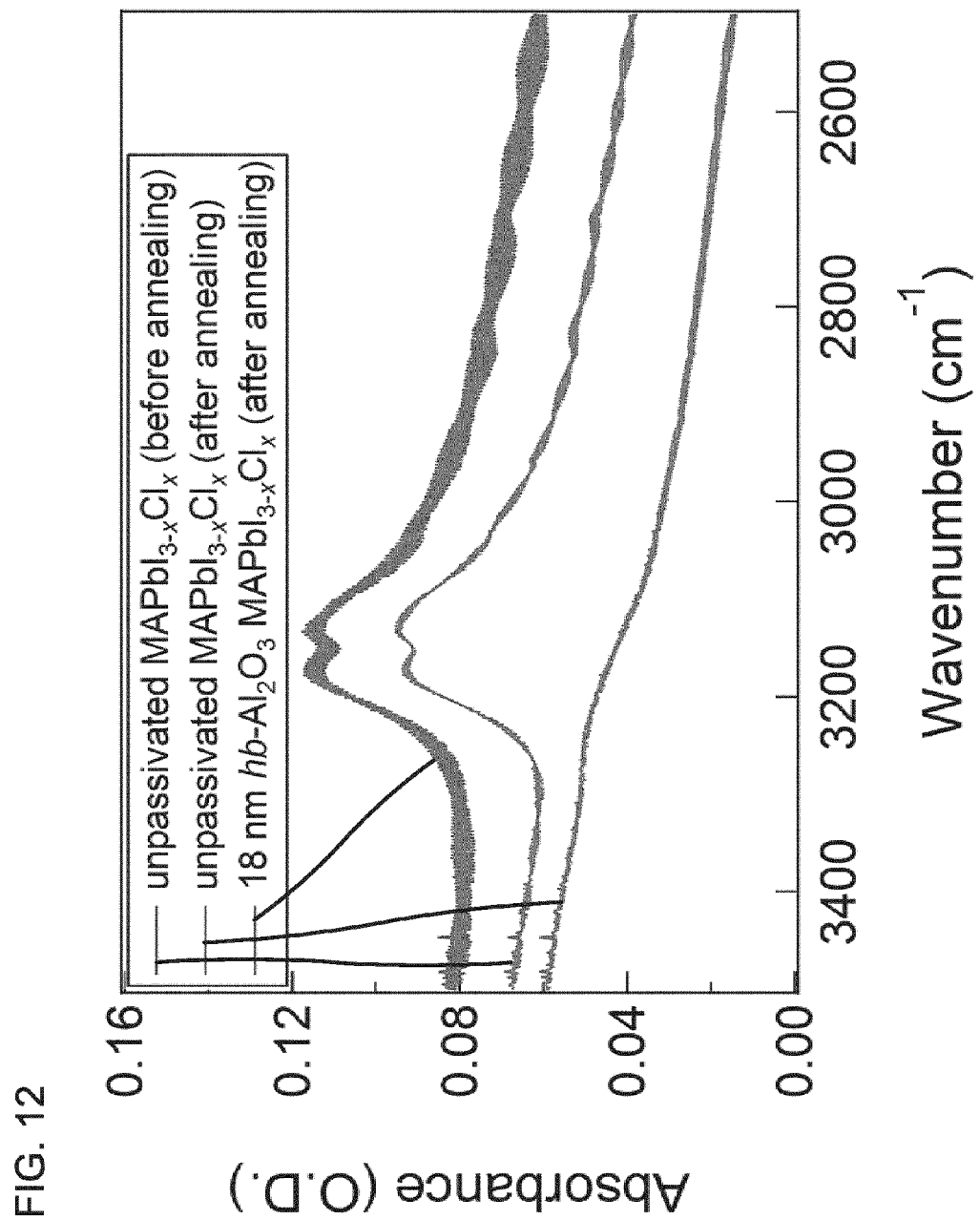
FIG. 12 is a Fourier transform infrared (FTIR) spectra of an unpassivated, and 18 nm $hb-Al_2O_3$ passivated $MAPbI_{3-x}Cl_x$ film after heating on a hotplate at 250 degrees Celsius in a $N_2$ filled glove box.
Figure 13:
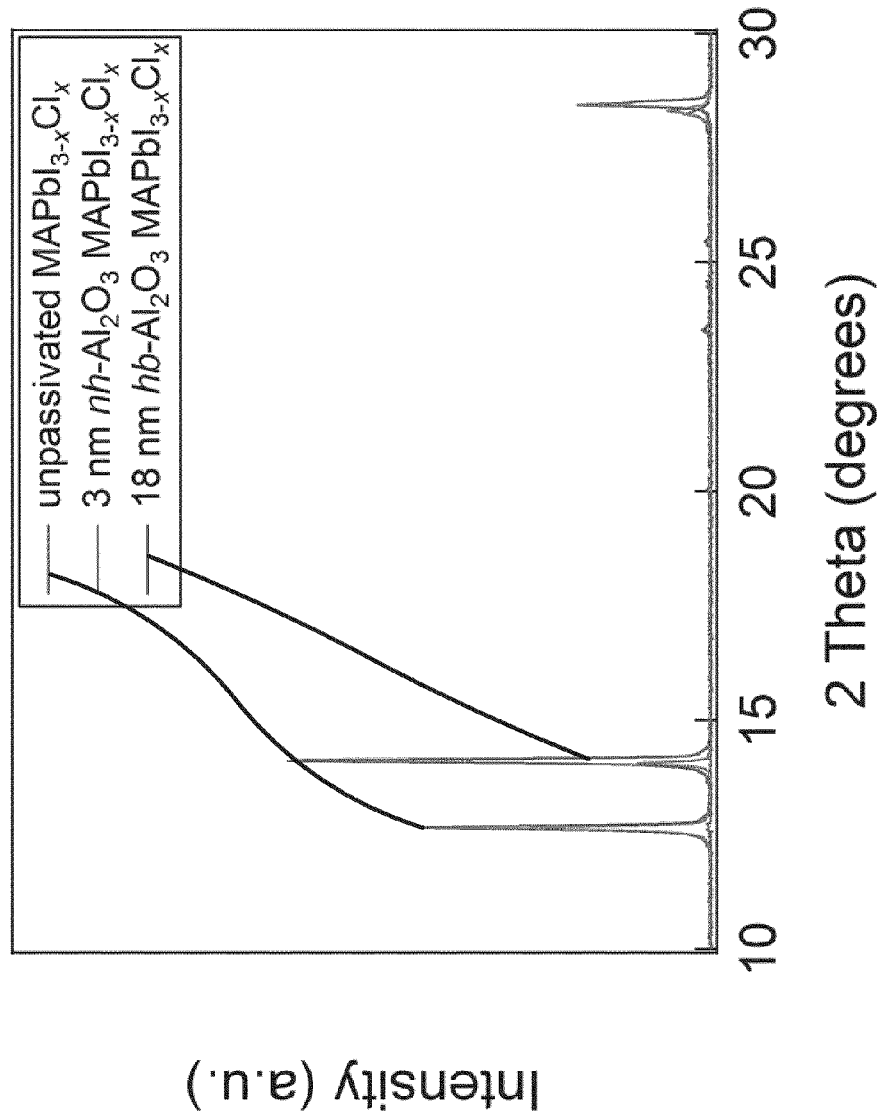
FIG. 13 is an XRD spectra of as deposited, 3 nm $nh-Al_2O_3$ film passivated and 18 nm $hb-Al_2O_3$ passivated $MAPbI_{3-x}Cl_x$ film after heating on a hotplate at 250 degrees Celsius in $N_2$ filled glove box for 70 seconds.

As shown in FIG. 11, upon heating, the unpassivated MAPbI$_{3-x}$Cl$_x$ film starts decomposing in less than 30 seconds, whereas the decomposition of 3 nm nh-Al$_2$O$_3$ passivated MAPbI$_{3-x}$Cl film initiates after about 1 minute indicating a notable improvement in thermal stability. Moreover, the 18 nm hb-Al$_2$O$_3$ passivated MAPbI$_{3-x}$Cl film remained stable for at least 30 minutes prior to developing local regions of degradation, demonstrating an almost 60× improvement in the thermal stability. To verify the extent of degradation via the presence of methyl ammonium species, Fourier transform infrared (FTIR) spectroscopy and XRD were performed on pre-heated and post-heated or annealed samples, which are shown in FIGS. 12 and 13, respectively. In pre-annealed unpassivated films, absorbance at approximately 3100 cm$^{-1}$ was dominated by methyl ammonium species. Methyl ammonium species were no longer present upon annealing in unpassivated films.

In stark contrast to unpassivated films, passivated films retained methyl ammonium species throughout the heating process. The results were further supported by XRD analysis shown in FIG. 13 performed after 70 seconds at 250 degrees Celsius. In agreement with the FTIR results, the unpassivated films exhibit XRD peaks that suggest complete decomposition into PbI$_2$, whereas the 3 nm nh-Al$_2$O$_3$ passivated films only showed partial degradation. Moreover, the 18 nm hb-Al$_2$O$_3$ remained as single phase MAPbI$_{3-x}$Cl$_x$ confirming exceptional endowed thermal stability even at 250° C. Table I summarizes the performance of various Al$_2$O$_3$ films in protecting the MAPbI$_{3-x}$Cl$_x$ film from water droplet, moisture and temperature.

TABLE I

Performance of Al$_2$O$_3$ passivation on MAPbI$_{3-x}$Cl$_x$ as a function of thickness.

| Al$_2$O$_3$ ALD | Al$_2$O$_3$ thickness (nm) | Stability of MAPbI$_{3-x}$Cl$_x$ film | | |
|---|---|---|---|---|
| | | 5 µL H$_2$O (s) | RH 85% (h) | 250° C. (min) |
| N/A | 0 | <1 | <12 | 0.5 |
| nh-ALD | 3 | <1 | ~24 | 1 |
| hb-ALD | 18 | >900 | >200 | >30 |

Figure 14:
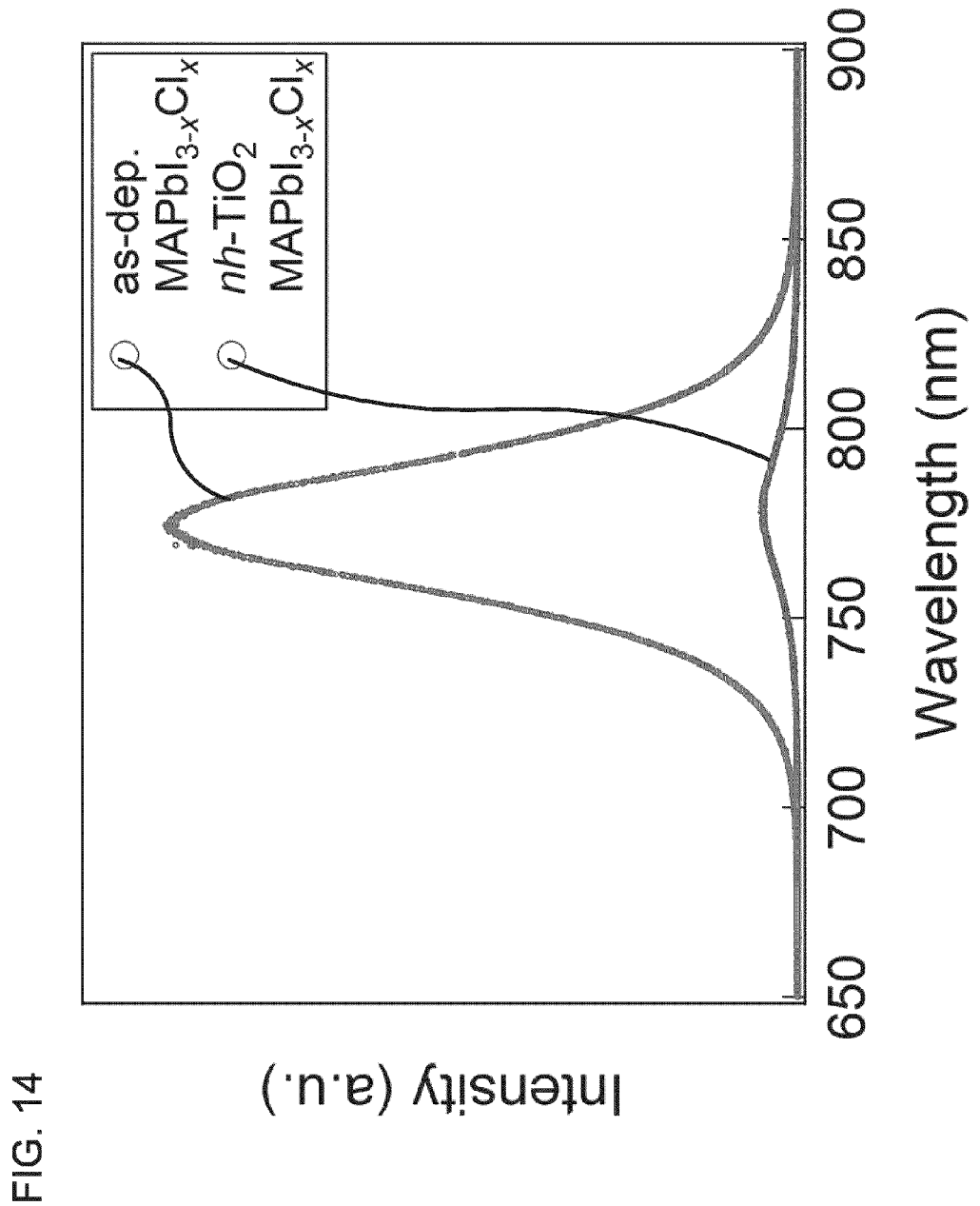
FIG. 14 is a plot of PL of an as deposited $MAPbI_{3-x}Cl_x$ thin film, and quenching of the PL of the $MAPbI_{3-x}Cl_x$ thin film after depositing a non-hydrolytic titanium oxide ($nh-TiO_2$) for 400 cycles on the $MAPbI_{3-x}Cl_x$ thin film verifying electron transport through the $nh-TiO_2$ film.

The feasibility of utilizing non-hydrolytic TiO$_2$ for enabling electron transport from the perovskite halide material was also demonstrated. Referring to FIG. 14, nh-TiO$_2$ was synthesized underneath and/or above MAPbI$_{3-x}$Cl$_x$ films to examine transport of electrons through nh-TiO$_2$, hence quenching photoluminescence (PL). As shown in FIG. 14, nh-TiO$_2$ deposited using 400 ALD cycles quenched the PL intensity to less than 10% of the uncoated film, clearly demonstrating that an nh-TiO₂ film can be used for perovskite halide films as well as for providing transfer of charges (e.g., electrons) created in the perovskite halide film to an electrode in contact with the nh-TiO₂ film.

As used herein, the singular forms "a", "an" and "the" include plural referents unless the context clearly dictates otherwise. Thus, for example, the term "a member" is intended to mean a single member or a combination of members, "a material" is intended to mean one or more materials, or a combination thereof.

As used herein, the terms "about" and "approximately" generally mean plus or minus 10% of the stated value. For example, about 0.5 would include 0.45 and 0.55, about 10 would include 9 to 11, about 1000 would include 900 to 1100.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes and omissions may also be made in the design, operating conditions and arrangement of the various exemplary embodiments without departing from the scope of the present invention.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Thus, particular implementations of the invention have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A method of protecting a perovskite halide film from moisture and temperature, comprising:
   positioning the perovskite halide film in a chamber;
   maintaining the chamber at a temperature of less than 200 degrees Celsius;
   inserting a first organo-metal compound into the chamber;
   subsequently inserting a non-hydrolytic oxygen source into the chamber;
   repeating the inserting of the first organo-metal compound and subsequent inserting of the non-hydrolytic oxygen source into the chamber for a predetermined number of cycles,
   wherein, the non-hydrolytic oxygen source and the first organo-metal compound interact in the chamber to deposit a non-hydrolytic metal oxide film on the perovskite halide film, the non-hydrolytic metal oxide film protecting the perovskite halide film from relative humidity of greater than 35% and a temperature of greater than 150 degrees Celsius;
   inserting a second organo-metal compound into the chamber;
   subsequently inserting a hydrolytic oxygen source into the chamber; and
   repeating the inserting of the organo-metal compound and subsequent inserting of the hydrolytic oxygen source into the chamber for a second predetermined number of cycles,
   wherein, the second organo-metal compound and hydrolytic oxygen source interact in the chamber to deposit a hydrolytic metal oxide film on the non-hydrolytic metal oxide film.

2. The method of claim 1, wherein the non-hydrolytic oxygen source includes a carboxylic acid.

3. The method of claim 2, wherein the carboxylic acid includes at least one of acetic acid and formic acid.

4. The method of claim 1, wherein the first organo-metal compound includes at least one of aluminum isopropoxide, aluminum triisopropoxide, titanium isopropoxide, titanium tetraisopropoxide, trimethylaluminum, dimethylaluminum isopropoxide, titanium phenyltriisopropoxide, titanocene dichloride, methyltitanium trichloride, aluminum trichloride, titanium tetrachloride or methyltriisopropoxytitanium.

5. The method of claim 4, wherein the non-hydrolytic metal oxide film includes at least one of aluminum oxide, titanium dioxide, zirconium oxide, hafnium oxide or silicon oxide.

6. The method of claim 1, wherein the hydrolytic oxygen source includes at least one of water or ozone.

7. The method of claim 1, wherein the perovskite halide film includes a compound of formula I:

$$ABX_3 \tag{I}$$

wherein,
A is organic or inorganic cation,
B is a metal cation, and
X is a halide.

8. The method of claim 7, wherein the perovskite halide film includes a compound of formula II:

$$ABY_{3-x}Z_x \tag{II}$$

wherein,
A is methylammonium or formamidinium,
B is Pb or Sn,
Y is I, Cl or Br,
Z is I, Cl or Br, and
x is 0, 1, 2 or 3.

9. A method of fabricating a photovoltaic cell, comprising:
depositing a perovskite halide film on a substrate;
positioning the substrate in a chamber;
maintaining the chamber at a temperature of less than 200 degrees Celsius;
inserting a titanium isopropoxide gas into the chamber;
subsequently inserting a non-hydrolytic oxygen source into the chamber; and
repeating the inserting of titanium isopropoxide gas and subsequent inserting of the non-hydrolytic oxygen source into the chamber for a predetermined number of cycles,
wherein, the non-hydrolytic oxygen source and the titanium isopropoxide gas interact in the chamber to deposit a non-hydrolytic titanium dioxide film on the perovskite halide film, the non-hydrolytic titanium dioxide film protecting the perovskite halide film from relative humidity of greater than 35% and a temperature of greater than 150 degrees Celsius, the non-hydrolytic titanium dioxide film transporting charges created in the perovskite halide film to an electrode in contact with the non-hydrolytic titanium dioxide film;
inserting an organo-metal compound into the chamber;
subsequently inserting a hydrolytic oxygen source into the chamber; and
repeating the inserting of the organo-metal compound and subsequent inserting of the hydrolytic oxygen source into the chamber for a predetermined number of cycles,
wherein, the hydrolytic oxygen source and the organo-metal compound interact in the chamber to deposit a hydrolytic metal oxide film on the non-hydrolytic titanium dioxide film.

10. The method of claim 9, wherein the substrate includes a conductive substrate or an electronically conducting film positioned on the substrate.

11. The method of claim 10, wherein the method further comprises:
prior to depositing the perovskite halide film on the substrate, positioning the substrate in the chamber;
inserting the titanium isopropoxide gas into the chamber;
subsequently inserting the non-hydrolytic oxygen source into the chamber; and
repeating the inserting of the titanium isopropoxide gas and subsequent inserting of the non-hydrolytic oxygen source into the chamber for a predetermined number of cycles,
wherein, the non-hydrolytic oxygen source and the titanium isopropoxide interact on the substrate to deposit a base non-hydrolytic titanium dioxide film on the substrate, the perovskite halide film coated on the base non-hydrolytic titanium dioxide film.

12. The method of claim 9, wherein the non-hydrolytic oxygen source includes a carboxylic acid.

13. The method of claim 9, wherein the organo-metal compound includes at least one of a aluminum isopropoxide, aluminum triisopropoxide, titanium isopropoxide, titanium tetraisopropoxide, trimethylaluminum, dimethyl aluminum isopropoxide, titanium phenyltriisopropoxide, titanocene dichloride, methyltitanium trichloride, aluminum chloride, titanium chloride or methyltriisopropoxytitanium.

14. The method of claim 9, wherein the hydrolytic oxygen source includes at least one of water or ozone.

15. The method of claim 9, wherein the perovskite halide film includes a compound of formula I:

$$ABX_3 \qquad (I)$$

wherein,
A is organic or inorganic cation,
B is a metal cation, and
X is a halide.

16. The method of claim 1, wherein the first organo-metal compound and the second organo-metal compound are the same.

* * * * *